(12) United States Patent
Chao et al.

(10) Patent No.: US 12,087,646 B2
(45) Date of Patent: *Sep. 10, 2024

(54) SYSTEMS AND METHODS FOR SUCTION PAD ASSEMBLIES

(71) Applicant: Taiwan Semiconductor Manufacturing Co., Ltd., Hsinchu (TW)

(72) Inventors: Yu-Hsiang Chao, Taipei (TW); Chi-Ping Lei, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/721,119

(22) Filed: Apr. 14, 2022

(65) Prior Publication Data

US 2022/0246483 A1 Aug. 4, 2022

Related U.S. Application Data

(63) Continuation of application No. 16/518,213, filed on Jul. 22, 2019, now Pat. No. 11,328,965.

(Continued)

(51) Int. Cl.
*H01L 21/66* (2006.01)
*B24B 37/005* (2012.01)
(Continued)

(52) U.S. Cl.
CPC .......... *H01L 22/26* (2013.01); *B24B 37/0053* (2013.01); *B24B 37/30* (2013.01); *H01L 21/30625* (2013.01)

(58) Field of Classification Search
CPC ............... B24B 37/0053; B24B 37/30; H01L 21/30635
See application file for complete search history.

(56) References Cited

U.S. PATENT DOCUMENTS 6,033,293 A * 3/2000 Crevasse ................. B24B 37/11
451/550
6,033,987 A * 3/2000 Lin .......................... B24B 49/16
451/384

(Continued)

FOREIGN PATENT DOCUMENTS

CN 1279506 A 1/2001
CN 102802871 A 11/2012

(Continued)

*Primary Examiner* — Mohammad M Choudhry
(74) *Attorney, Agent, or Firm* — Duane Morris LLP

(57) ABSTRACT

In an embodiment, a system includes: a pad comprising a first side and a second side opposite the first side, wherein the first side is configured to receive a wafer during chemical mechanical planarization (CMP), and a platen adjacent the pad along the second side, wherein the platen comprises a suction opening that interfaces with the second side; a pump configured to produce suction at the suction opening to adhere the second side to the platen; and a sensor configured to collect sensor data characterizing a uniformity of adherence between the pad and the platen, wherein the pump is configured to produce the suction at the suction opening based on the sensor data.

20 Claims, 20 Drawing Sheets

Related U.S. Application Data

(60) Provisional application No. 62/712,703, filed on Jul. 31, 2018.

(51) Int. Cl.
    *B24B 37/30*      (2012.01)
    *H01L 21/306*      (2006.01)

(56) References Cited

U.S. PATENT DOCUMENTS

| | | | | |
|---|---|---|---|---|
| 2002/0034928 A1* | 3/2002 | Doan | ............... | B24D 9/085 |
| | | | | 451/285 |
| 2004/0110449 A1 | 6/2004 | Obeng | | |
| 2004/0187304 A1 | 9/2004 | Chen | | |
| 2007/0103657 A1* | 5/2007 | Yoshitake | ............ | B82Y 40/00 |
| | | | | 355/75 |
| 2010/0224256 A1* | 9/2010 | Tseng | ............... | G01F 11/28 |
| | | | | 137/565.29 |
| 2012/0088316 A1* | 4/2012 | Lu | .................. | H01L 21/67265 |
| | | | | 438/5 |
| 2013/0052917 A1 | 2/2013 | Park | | |
| 2013/0078812 A1 | 3/2013 | Spiegel | | |
| 2013/0217306 A1 | 8/2013 | Wu | | |
| 2013/0273266 A1* | 10/2013 | Niiyama | ............... | C09J 4/00 |
| | | | | 156/247 |
| 2017/0157733 A1 | 6/2017 | Shi | | |
| 2017/0239719 A1* | 8/2017 | Buller | ............... | B23K 26/032 |
| 2020/0140211 A1* | 5/2020 | Iwasaka | ............ | H01L 21/67784 |

FOREIGN PATENT DOCUMENTS

| | | |
|---|---|---|
| CN | 105058225 A | 11/2015 |
| CN | 206105652 U | 4/2017 |
| CN | 106853610 A | 6/2017 |
| CN | 107919296 A | 4/2018 |
| JP | 2003151934 A | 5/2003 |
| JP | 2003282504 A | 10/2003 |
| JP | 200800819 A | 1/2008 |

\* cited by examiner

SYSTEMS AND METHODS FOR SUCTION PAD ASSEMBLIES

CROSS-REFERENCE TO RELATED APPLICATION

This application is a continuation of U.S. patent application Ser. No. 16/518,213, filed Jul. 22, 2019, which claims priority to U.S. Provisional Patent Application No. 62/712,703, filed on Jul. 31, 2018, each of which are incorporated by reference herein in their entireties.

BACKGROUND

Integrated circuits are typically comprised of a plurality of semiconductor devices formed in or on a substrate. In current applications, integrated circuits can consist of literally thousands or millions of individual semiconductor devices formed in or on the substrate. Typically, large numbers of integrated circuits are formed on a single wafer by selectively exposing regions of the wafer so as to allow for deposition or implantation of impurities into a wafer to thereby alter the characteristics of the wafer to produce the desired different semiconductor devices. The semiconductor devices can be formed in the exposed regions of the wafer using well-known masking techniques in conjunction with well-known diffusion, implantation or deposition techniques.

Semiconductor device fabrication techniques have been developed which allow for a higher density of semiconductor devices to be formed in the integrated circuit. As the scale of integration has increased and as the size of the individual semiconductor devices has decreased, it has become more important that integrated circuit designers and fabricators consider the structural integrity of the deposited devices and of the integrated circuit as a whole.

Repeated deposition of materials into the exposed regions of the wafer can result in the integrated circuit having a non-planar upper surface. As the upper surface of the integrated device becomes less planar, the ability to form additional semiconductor devices on the integrated circuit becomes more difficult. Moreover, the existence of protrusions in the topography of the integrated circuit affects the structural integrity of the circuit and can result in failure of the device. Consequently, integrated circuit designers and fabricators have increasingly used planarization techniques to planarize the upper surface of the integrated circuits during fabrication.

One particular planarization technique is known as chemical mechanical planarization (CMP). CMP is a technique whereby the upper surface of a wafer is globally planarized by simultaneously abrasively polishing and etching the upper surface of the wafer. Basically, the wafer is positioned adjacent a pad that is moved with respect to the wafer. In certain implementations, the wafer is mounted upside down on a carrier in a CMP tool. A force pushes the carrier and the wafer downward toward the pad. An abrasive encapsulated within a suspension fluid may be introduced. The pad is then applied to the wafer so that protrusions in the surface topography of the integrated circuits on the wafer can be removed by a combination of abrasive polishing and etching to thereby planarize and polish the upper surface of the wafer.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1A:
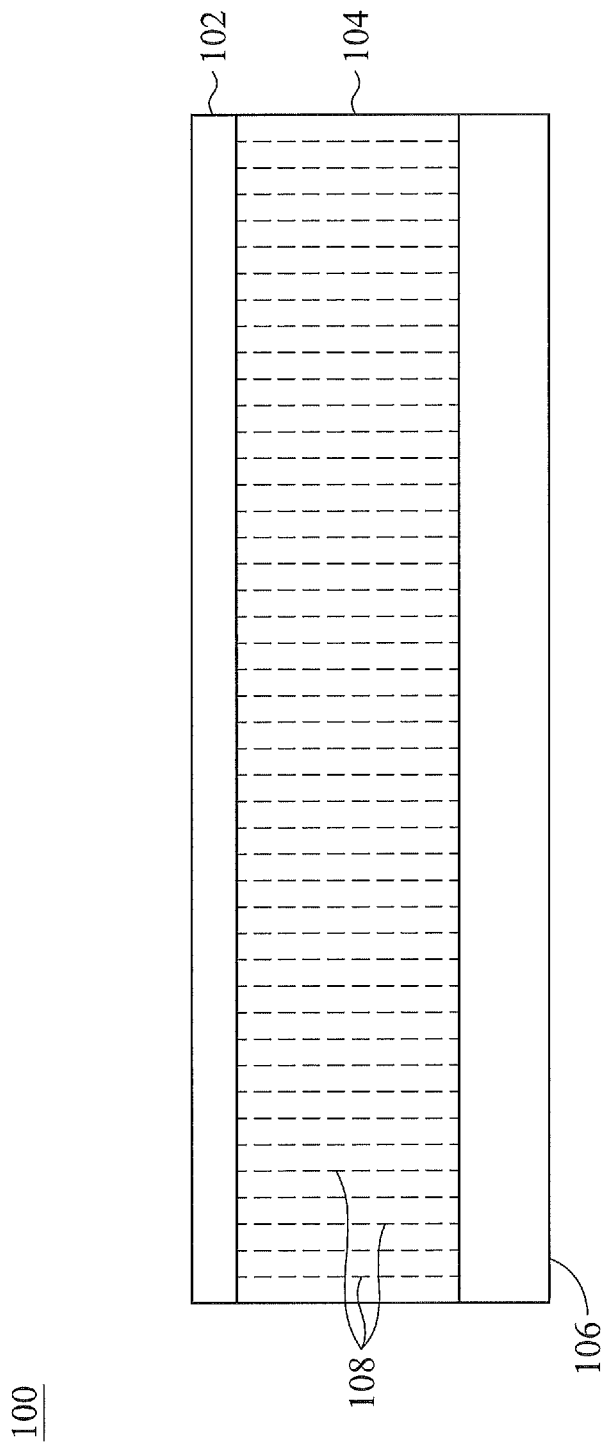
FIG. 1A is a cross sectional illustration of a suction pad assembly, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a suction pad assembly. A suction pad assembly includes a suction platen with suction openings at which a pump (e.g., a vacuum pump) may produce suction to adhere a pad to the suction platen. The suction platen may be spun or otherwise moved, thus also moving the pad with the suction platen. The pad may be configured for chemical mechanical planarization (CMP) and thus have a working surface with a number of small asperities used to contact a wafer to be polished. Opposite the working surface, the pad may have an underlying surface configured to adhere to the suction platen via the suction force at the suction openings. In certain embodiments, the working surface opposite the underlying surface may have different textures. For example, the working surface may be rougher than the underlying surface.

In various embodiments, the suction openings may be sufficiently dense and, in conjunction with a pump, produce a sufficient amount of suction for the performance of CMP. As noted above, the performance of CMP includes eroding or polishing a wafer against a pad. Thus the adherence of the pad against a suction platen may be sufficiently strong to avoid slippage of the pad against the suction platen while the suction platen is moving during CMP. For example, certain suction platens may have at least one suction opening per 16 square centimeters (cm), or from about 5 square cm to about 30 square cm along an upper surface of the suction platen adjacent the underlying surface of the pad. Also, the suction at a suction opening at the upper surface of the suction platen may be between about 0.0001 atmospheres (ATM) and about 0.8 ATM to hold an item via suction forces in a secure manner. Furthermore, a cross sectional area of a suction opening may be between about 0.001 millimeters squared ($mm^2$) to about 10 $mm^2$ to focus the suction forces at the suction opening In various embodiments, the underlying surface of a pad may have certain portions that also include an adhesive layer, or a layer of adhesive, thus allowing for adhesion to the suction platen via the adhesive layer and the suction force of the suction openings at the upper surface of the suction platen.

In certain embodiments, the underlying surface of the pad may be substantially smooth and thus prone to slippage or movement if not adhered to the suction platen via a suction force at the suction openings. For example, the underlying surface may be smooth and thus may slide when not secured. Accordingly, to avoid the pad slipping off of the suction platen when the suction force is not applied, lateral guards may be disposed around the extreme edges of the pad (e.g., a pad's circumference or periphery) to secure the pad to the suction platen. The lateral guards may be part of the suction platen to move (e.g., spin) with the suction platen during performance of CMP or may be separate from the suction platen to not move with the suction platen during performance of CMP. Also, the lateral guards may be continuous around the extremities of the pad to laterally enclose the pad, or may intermittently surround the extremities of the pad to not laterally enclose the pad but still be sufficient to orient the pad on the suction platen. Advantageously, when the lateral guards are intermittent and not continuous around the extremities of the pad, the pad may be more easily removed from the suction platen by directly manipulating the pad from a lateral direction, rather than needing to avoid the lateral guards and manipulate the pad from atop the pad, or from a vertical direction.

In various embodiments, sensors may be utilized to assess performance of the suction pad assembly during CMP in an automated manner. These sensors may be any type of sensor that may sense, for example, the amount or uniformity of suction at the suction openings and/or any surface non-uniformities that develop along the working surface during CMP. For example, a suction failure may include an insufficient or lack of suction force at particular suction openings. This may cause parts of the pad to lift from the suction platen. The lifting of the pad from the suction platen may be detrimental to CMP processing as it is a non-uniformity (e.g., a non-planar feature) along the working surface of the pad utilized to polish a wafer. However, such suction failures may be detected via a sensor that determines if the suction at a suction opening is within nominal or expected values (e.g., is not abnormal). Also, such suction failures may be detected via a sensor that determines whether the working surface of the pad is uniform (e.g., without folds). Stated another way, sensors may be utilized to detect for an abnormality during CMP. The sensors may produce sensor data that may be analyzed for detection of an abnormality. The abnormality may be an outlier or a situation where a sensor data value exceeds a predetermined threshold value. If an abnormality is detected, remediation of the suction pad assembly may be performed to remediate and correct for the abnormality. For example, the CMP process may be stopped and the pad replaced. Or, as another example, a particular pump associated with the abnormality may be inspected, repaired, and/or replaced.

Various types of sensors may be utilized for such inspections, such as optical sensors, pressure sensors, and the like. Examples of optical sensors may include, for example, a charge coupled device (CCD). These optical sensors may detect radiation across the visible light and/or non-visible light spectrum (e.g., the infrared spectrum). Pressure sensors may measure an air pressure relative to a standard pressure, such as an atmospheric pressure. For example, the pressure sensor may measure pressure relative to atmospheric pressure or a vacuum. In certain embodiments, a single sensor may be utilized to inspect a suction pad assembly for abnormalities. However, in other embodiments, multiple sensors may be utilized either simultaneously or in series to inspect a suction pad assembly for abnormalities.

As noted above, a suction pad assembly may include a pump to produce a suction force at the suction openings of the suction platen. Accordingly, each suction opening may be associated with a pump to produce the suction force at each respective suction opening. In certain embodiments, all of the suction openings may be associated (e.g., in fluid communication with) a single pump. Accordingly, the single pump may drive the suction force at all of the suction openings. However, in other embodiments, not all of the suction openings are associated with the single pump. For example, each suction opening may be associated with its own pump and/or certain groups of suction openings may be associated with different suction pumps. In various embodiments, the suction openings may be structured such that the suction at the suction opening may be modulated by, for example, changing a cross sectional area of the suction opening to produce more or less suction at the suction opening.

In particular embodiments, the arrangement of the suction openings may be modulated as desired for different applications in various embodiments. For example, the suction openings may be arranged in a grid or in a concentric format. Also, the suction openings may have uniform or variable cross sectional areas and/or shapes. Furthermore, different suction platens may have different cross sectional shapes at the suction openings, such as circles, ellipses, triangles, squares, and/or other polygonal cross sectional shapes.

FIG. 1A is a cross sectional illustration of a suction pad assembly 100, in accordance with some embodiments. The suction pad assembly 100 may include a pad 102, a suction platen 104, and a pump support structure 106. The suction platen 104 may include a plurality of suction openings 108, illustrated with dotted lines. The pump support structure 106 may include at least one pump in fluid communication with the suction openings 108 to produce a suction force at the suction openings 108 that interface with the pad 102. Stated another way, the suction openings 108 may define regions of suction force, produced by a pump of the pump support structure 106, that adhere the pad 102 to the suction platen 104. The pump support structure 106 may generically represent structure in which a pump may be housed or supported to interface with the suction platen 104. The pump support structure 106 and constituent pump(s) are described in greater detail below and will not be discussed here for brevity. As noted above, this suction force in aggregate is sufficient to adhere the pad 102 to the suction platen 104 during performance of CMP (e.g., to have the pad 102 rotate with the suction platen 104 as the suction platen rotates during CMP).

Figure 1B:
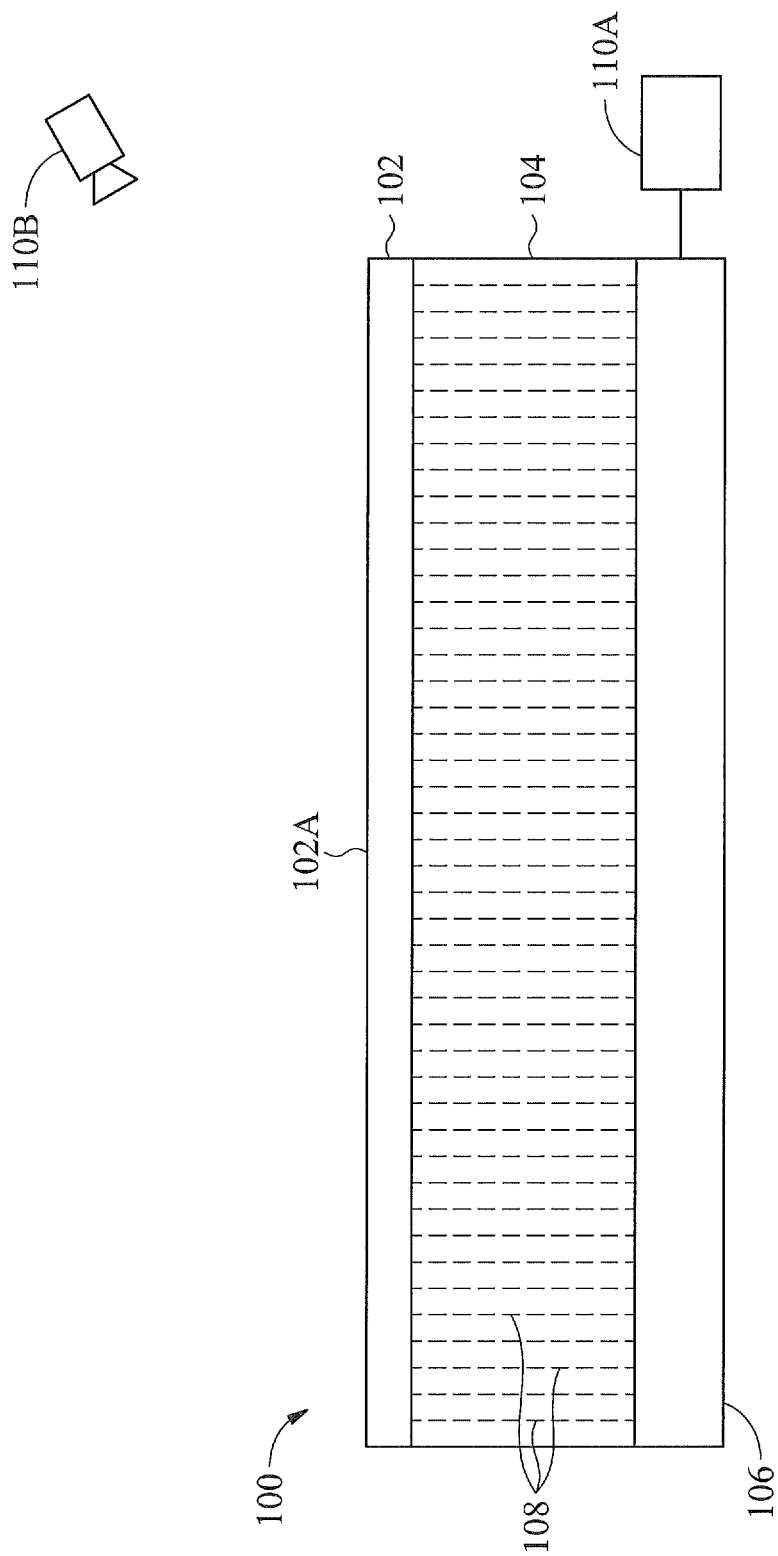
FIG. 1B is a cross sectional illustration of a suction pad assembly with sensors, in accordance with some embodiments.

FIG. 1B is a cross sectional illustration of a suction pad assembly 100 with sensors 110A, 110B, in accordance with some embodiments. As noted above, the sensors 110A, 110B may be utilized to assess performance of the suction pad assembly during CMP in an automated manner. These sensors 110A, 110B may be any type of sensor that may sense, for example, the amount or uniformity of suction at the suction openings and/or any surface non-uniformities that develop along the working surface 102A of the pad 102 during CMP.

For example, an abnormality such as a suction failure may include an insufficient or lack of suction force at particular suction openings 108. This may cause parts of the pad 102 to lift from the suction platen 104. The lifting of the pad 102 from the suction platen 104 may be detrimental to CMP processing as it is a non-uniformity along the working surface 102A of the pad utilized to polish a wafer. In contrast, it may be desirable to have the working surface 102A be uniform and planar for effective polishing. Such suction failures may be detected via a sensor 110A, 110B that determines if the suction at a suction opening 108 is within nominal or expected values. The suction at a particular suction opening 108 may be detected by a pressure sensor 110A. Also, such suction failures may be detected via a sensor 110B that determines whether the working surface of the pad is uniform (e.g., without folds). This sensor 110B may be an optical sensor 110B. For example, the optical sensor 110B may be an electronic detector (e.g., a charge coupled device (CCD)) that converts light, or a change in light detected at the optical sensor into an electronic signal (e.g., image data). This image data may be analyzed for nonuniformities along the surface of the pad indicative of folds. For example, different frames or discrete parts (e.g., images or parts of images) of the image data may be compared to determine the presence of abnormalities or outliers in the image data. Specifically, edge detection, thresholding, color based segmentation, or other types of image segmentation techniques may be utilized to find various features in the image data. Then, based on comparing the detected features, outliers in the sensor data may be determined as possible abnormalities via supervised or unsupervised learning. The determination or definitions of outliers may be made in accordance with conventional statistical analysis for outliers. Accordingly, by analyzing aggregated data over time, an abnormality may be determined based on detection of an outlier from the aggregated data. In certain embodiments, these outliers may determine threshold values, which when passed, may define an abnormality. These outliers may be determined in accordance with conventional statistical analysis for outliers. Further examples of how suction failures may be detected via a sensor 110B as abnormalities are discussed below.

These sensors 110A, 110B may produce sensor data that may be analyzed for detection of an abnormality. The abnormality may be an outlier or a situation where a sensor data value exceeds a predetermined threshold value. If an abnormality is detected, remediation of the suction pad assembly 100 may be performed to remediate and correct for the abnormality. For example, the CMP process may be stopped and the pad replaced. Or, as another example, a particular pump associated with the abnormality may be inspected, repaired, and/or replaced.

As noted above, various types of sensors may be utilized for such inspections, such as optical sensors 110B, pressure sensors 110A, and the like. Examples of optical sensors 110B may include, for example, a charge coupled device (CCD). These optical sensors 110B may detect radiation across the visible light and/or non-visible light spectrum (e.g., the infrared spectrum). Pressure sensors 110A may measure an air pressure relative to a standard pressure, such as an atmospheric pressure. For example, the pressure sensor 110A may measure pressure relative to atmospheric pressure or a vacuum. In certain embodiments, a single sensor may be utilized to inspect a suction pad assembly for abnormalities. However, in other embodiments, multiple sensors may be utilized either simultaneously or in series to inspect a suction pad assembly for abnormalities.

Figure 1C:
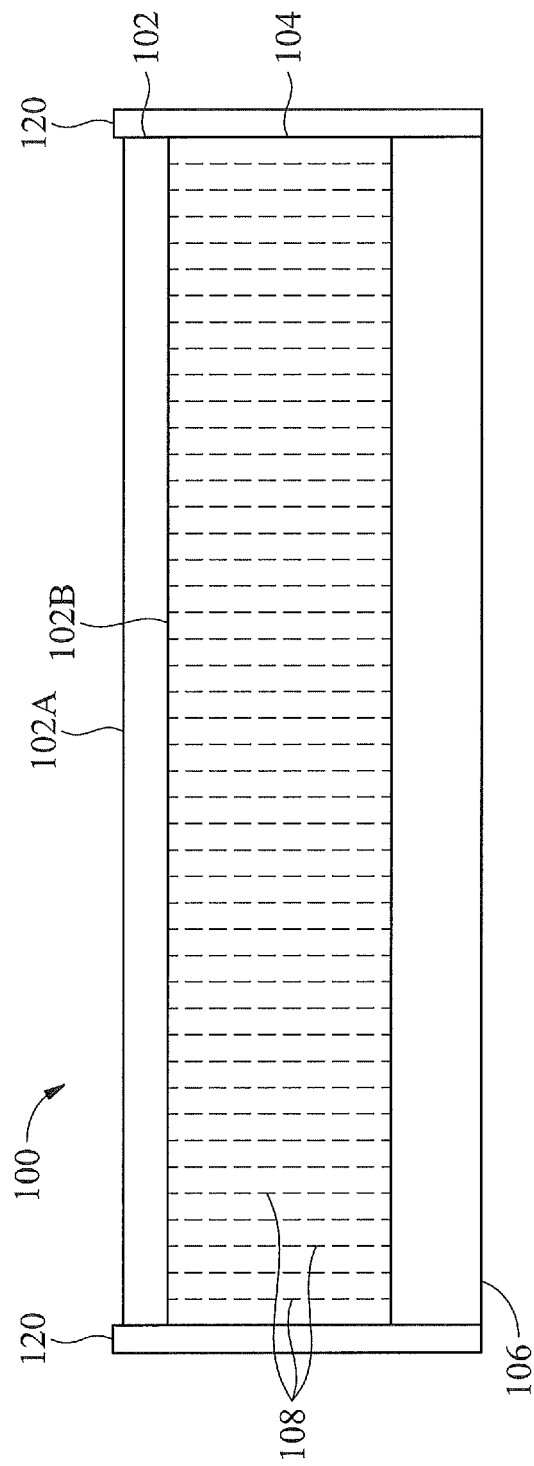
FIG. 1C is a cross sectional illustration of a suction pad assembly with lateral guards, in accordance with some embodiments.

FIG. 1C is a cross sectional illustration of a suction pad assembly 100 with lateral guards 120, in accordance with some embodiments. As introduced above, the underlying surface 102B of the pad 102 may not be adhered to the suction platen 104 when suction force is not applied at the suction openings 108 (e.g., when a motor that produces suction at the suction openings 108 is not activated). In certain embodiments, the working surface 102A opposite the underlying surface 102B may have different textures. For example, the illustrated working surface 102A may be rougher than the illustrated underlying surface 102B. The pad 102 may be prone to slip off of the suction platen 104 when the suction force is not applied at the suction openings 108. Accordingly, to avoid the pad 102 slipping off of the suction platen 104 when the suction force is not applied, lateral guards 120 may be disposed around the extreme edges of the pad 102 (e.g., a pad's circumference) to secure the pad 102 to the suction platen 104 as bound within the lateral guards 120.

In certain embodiments, the lateral guards 120 may be part of (e.g., adhered to or formed as one piece with) the suction platen 104 to move (e.g., spin) with the suction platen 104 during performance of CMP or may be separate from the suction platen 104 to not move with the suction platen 104 during performance of CMP. Also, the lateral guards 120 may be continuous around the extremities of the pad 102 to laterally enclose the pad 102, or may intermittently surround the extremities of the pad 102 to not laterally enclose the pad 102 but still be sufficient to orient the pad 102 on the suction platen 104. Advantageously, when the lateral guards 120 are intermittent and not continuous around the extremities of the pad 102, the pad 102 may be more easily removed from the suction platen 104 by directly manipulating the pad 102 from a lateral direction, rather than needing to avoid the lateral guards 120 and manipulate the pad 102 from atop the pad 102.

In various embodiments, the lateral guards may extend between and abut both the working surface 102A and the underlying surface 102B of the pad. However, in other embodiments, the lateral guards may not extend entirely from the underlying surface 102B of the pad to reach the working surface 102A.

Figure 1D:
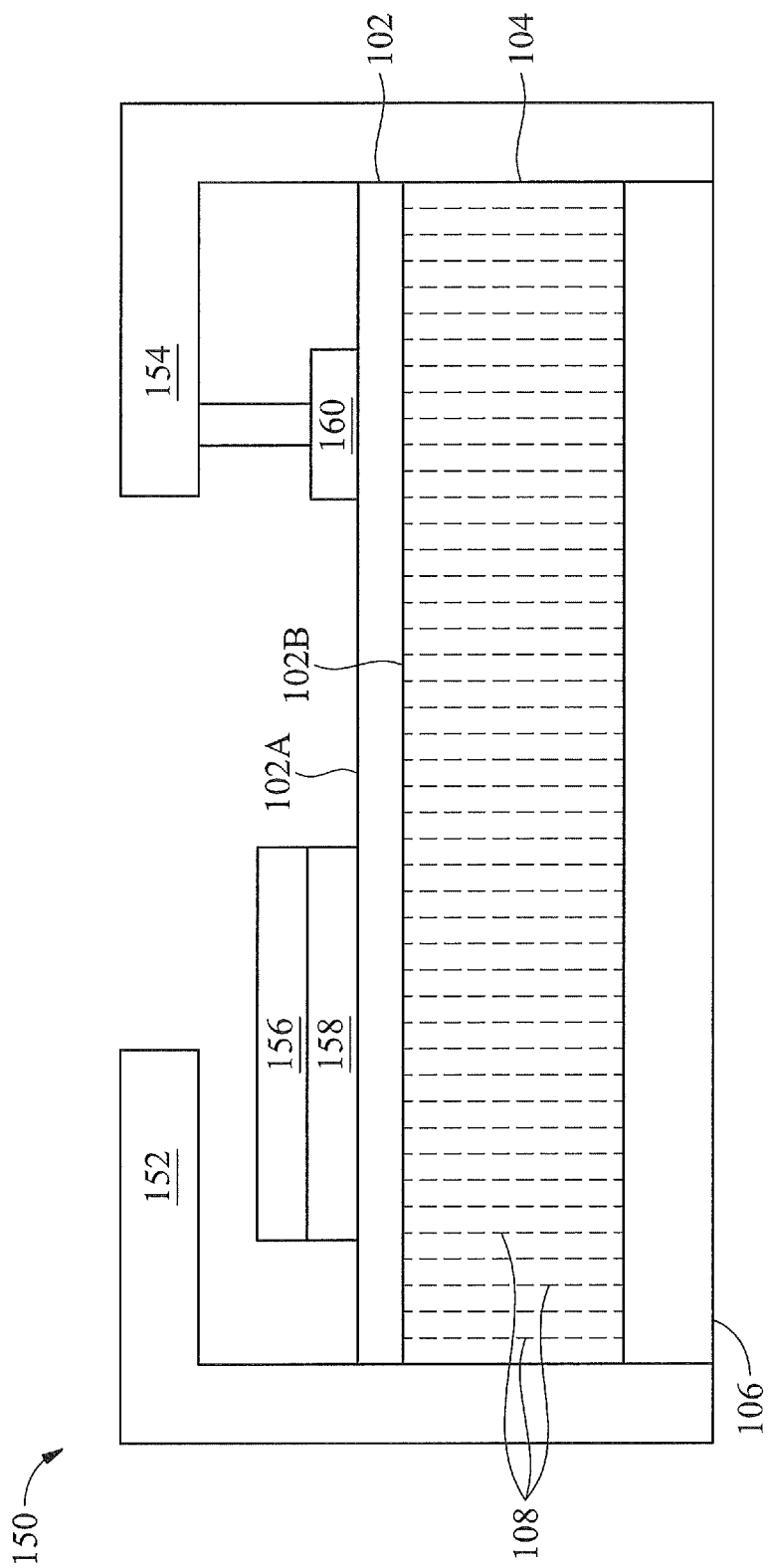
FIG. 1D is a cross sectional illustration of a suction pad assembly with chemical mechanical planarization (CMP) structures, in accordance with some embodiments.

FIG. 1D is a cross sectional illustration of a suction pad assembly with chemical mechanical planarization (CMP) structures, in accordance with some embodiments. The combination of the suction pad assembly with CMP structures may be referred to as a polishing station 150. The polishing station 150 may also have a polishing fluid delivery module (e.g., slurry) 152, pad conditioner module 154, and a carrier head 156 configured to press a wafer 158 against the pad 102. In certain embodiments, the polishing fluid delivery module 152 may comprise a slurry delivery arm.

The polishing station 150 is adapted to position the polishing fluid delivery module 152 and the carrier head 156 relative to the polishing surface (e.g., upper surface) of the pad 102, and further is adapted to provide a relative motion therebetween. The carrier head 156 may physically move the wafer 158 and transfer a polishing force (e.g., downward force) to the wafer 158, sandwiching the wafer 158 between the carrier head 156 and the pad 102. The pad conditioner module 154 may sweep a conditioning head 160 across the working surface 102A of the pad 102 to condition (e.g., dress the pad 102 with an abrasive surface to produce a desired asperity structure) the working surface 102A.

Figure 2A:
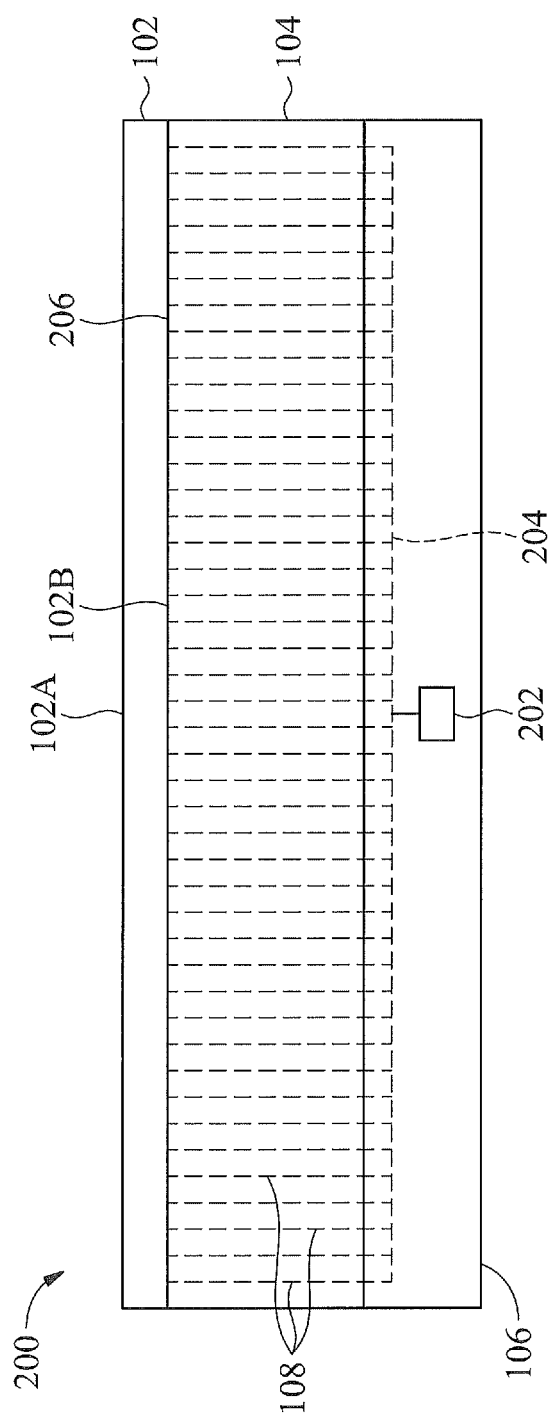
FIG. 2A is a cross sectional illustration of a suction pad assembly with a combined pump, in accordance with some embodiments.

FIG. 2A is a cross sectional illustration of a suction pad assembly 200 with a combined pump 202, in accordance with some embodiments. The combined pump 202 may be part of the pump support structure 106. As noted above, the pump support structure may generically represent structure in which a pump may be housed or supported to interface with the rest of the suction pad assembly 200. The combined pump 202 may be in fluid communication with each of the suction openings 108 to produce a suction force at each of the suction openings 108. For example, each of the suction openings 108 may be connected via a conduit 204 to interface with the combined pump 202. Also, the suction openings 108 may terminate at an upper surface 206 of the suction platen, which is configured to interface with the pad 102. Accordingly, the combined pump 202 may produce a suction force at each of the suction openings 108 that adheres the pad 102 to the suction platen 104 along the upper surface 206 of the suction platen.

Figure 2B:
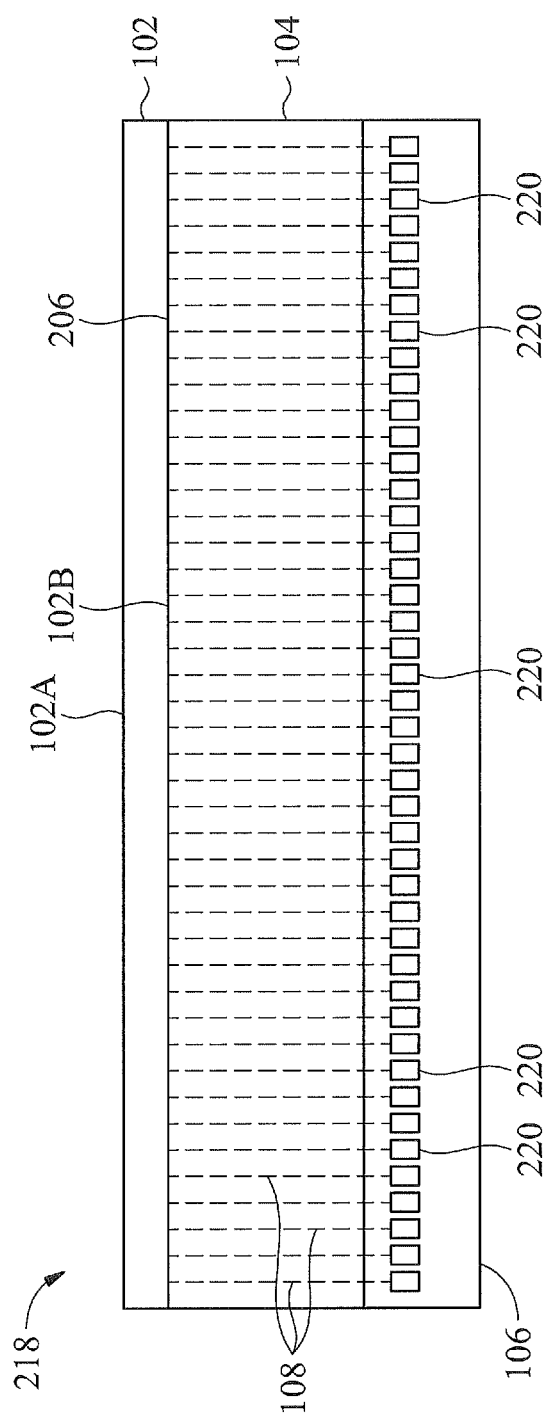
FIG. 2B is a cross sectional illustration of a suction pad assembly with individual pumps, in accordance with some embodiments.

FIG. 2B is a cross sectional illustration of a suction pad assembly 218 with individual pumps 220, in accordance with some embodiments. The individual pumps 220 may be part of the pump support structure 106. The individual pumps 220 may be in fluid communication with respective the suction openings 108 to produce a suction force at each of the suction openings 108. For example, each of the suction openings 108 may be connected directly to and interface with a respective individual pump 220, which may be rotate with (e.g., be stationary relative to) the platen 104 during rotation of the platen 104. As noted above, the suction openings 108 may terminate at an upper surface 206 of the suction platen, which is configured to interface with the pad 102. Accordingly, each individual pump 220 may produce a suction force at each of the suction openings 108 that adheres the pad 102 to the suction platen 104 along the upper surface 206 of the suction platen. In some embodiments, at least two of the pumps 220 may produce different suction forces at the corresponding suction openings 108, for example, according to the sensing result of the sensors 100A and/or 100B (shown in FIG. 1B).

Figure 2C:
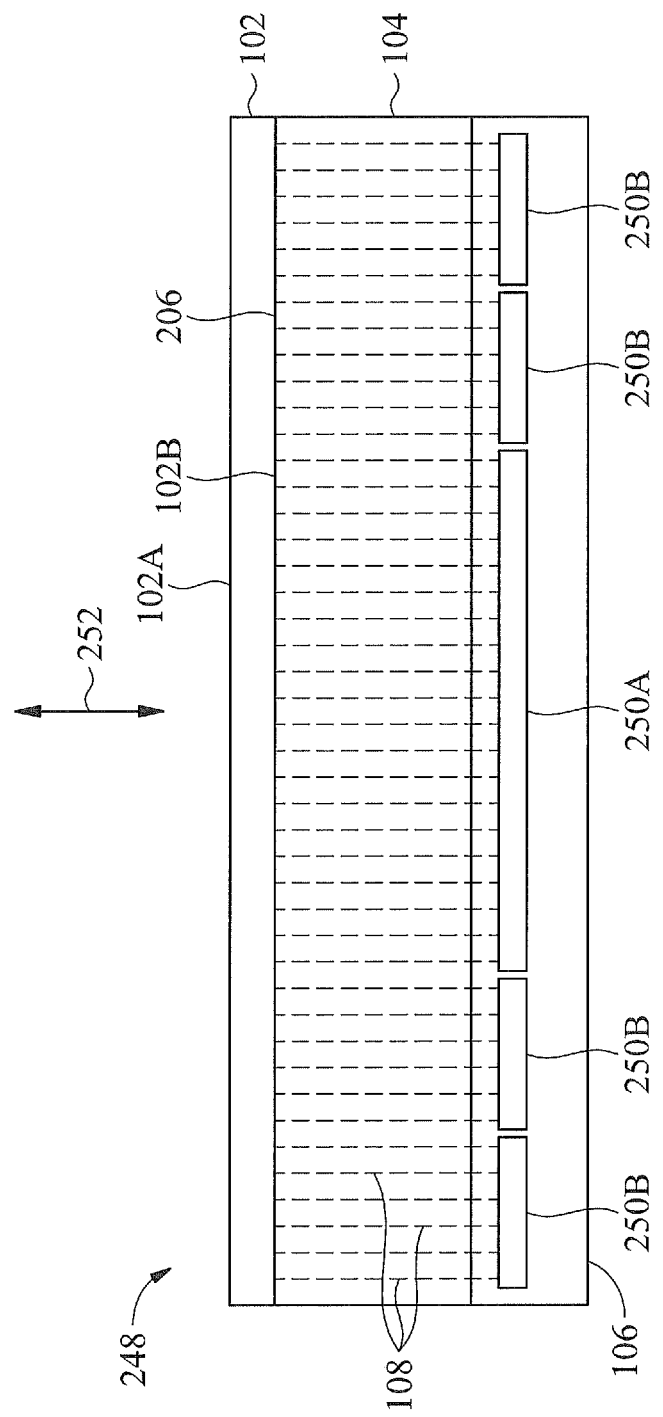
FIG. 2C is a cross sectional illustration of a suction pad assembly with variable pumps, in accordance with some embodiments.

FIG. 2C is a cross sectional illustration of a suction pad assembly 248 with variable pumps 250A, 250B, in accordance with some embodiments. By being variable, the variable pumps 250A and 250B may be associated with a variable (e.g., different) numbers of suction openings 108. The variable pumps 250A, 250B may be part of the pump support structure 106. The variable pumps 250A, 250B may be in fluid communication with respective the suction openings 108 to produce a suction force at each of the suction openings 108. Specifically, an inner variable pump 250A may be in fluid communication with suction openings 108 toward a center axis 252 of the suction pad assembly 100 while outer variable pumps 250B may be in fluid communication with suction openings further from the center axis 252 of the suction pad assembly than the inner variable pump 250A. The center axis 252 may define a center point from which the extremities (e.g., circumference) of the pad 102 are substantially equidistant. Also, there may be only a single inner variable pump 250A while there are multiple outer variable pumps 250B. Furthermore, the inner variable pump 250A may interface with more suction openings than any single outer variable pump 250B. Advantageously, the inner variable pump 250A may apply a different amount of suction force per suction opening relative to the outer variable pumps 250B for power savings (e.g., by not operating each pump to its full capacity for suction force) and/or to calibrate the amount of suction force per suction opening to scale with a corresponding amount of centrifugal force at a particular region of the pad 102. As noted above, the suction openings 108 may terminate at an upper surface 206 of the suction platen, which is configured to interface with the pad 102. Accordingly, each individual pump 220 may produce a suction force at each of the suction openings 108 that adheres the pad 102 to the suction platen 104 along the upper surface 206 of the suction platen.

Figure 3A:
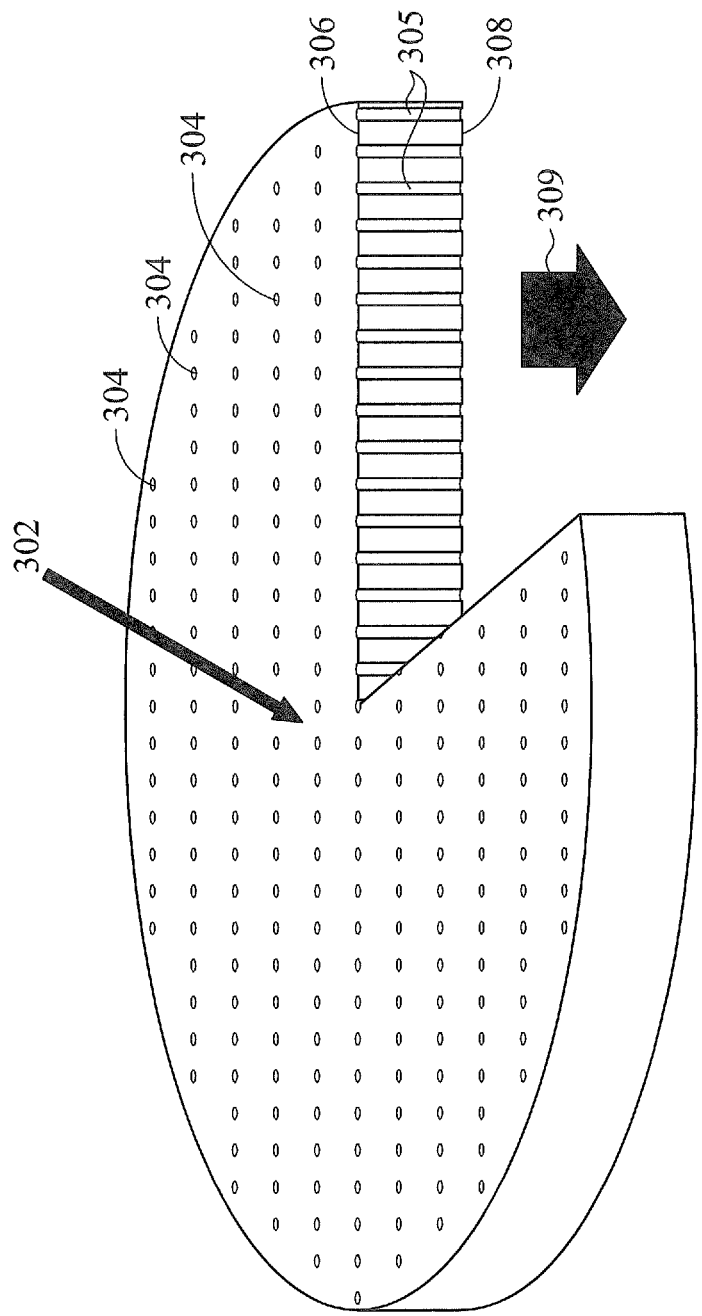
FIG. 3A is a perspective illustration of a suction platen, in accordance with some embodiments.

FIG. 3A is a perspective illustration of a suction platen 302, in accordance with some embodiments. The suction platen 302 may include a number of suction openings 304 along an upper surface 306 of the suction platen 302. The suction openings 304 may include a suction passage 305 that extends from the upper surface 306 of the suction platen 302 to a lower surface 308 of the suction platen 302. The suction openings 304 may be substantially devoid of material so that a suction force 310 applied to the suction openings 304 at the lower surface 308 may also be transferred and applicable to the upper surface 306 of the suction platen 302. In certain embodiments, the suction force may be produced by a pump which pumps air out from the suction opening at the lower surface 308. In various embodiments, the suction force produces a lower atmospheric pressure at the suction opening than elsewhere along the suction platen 302.

Figure 3B:
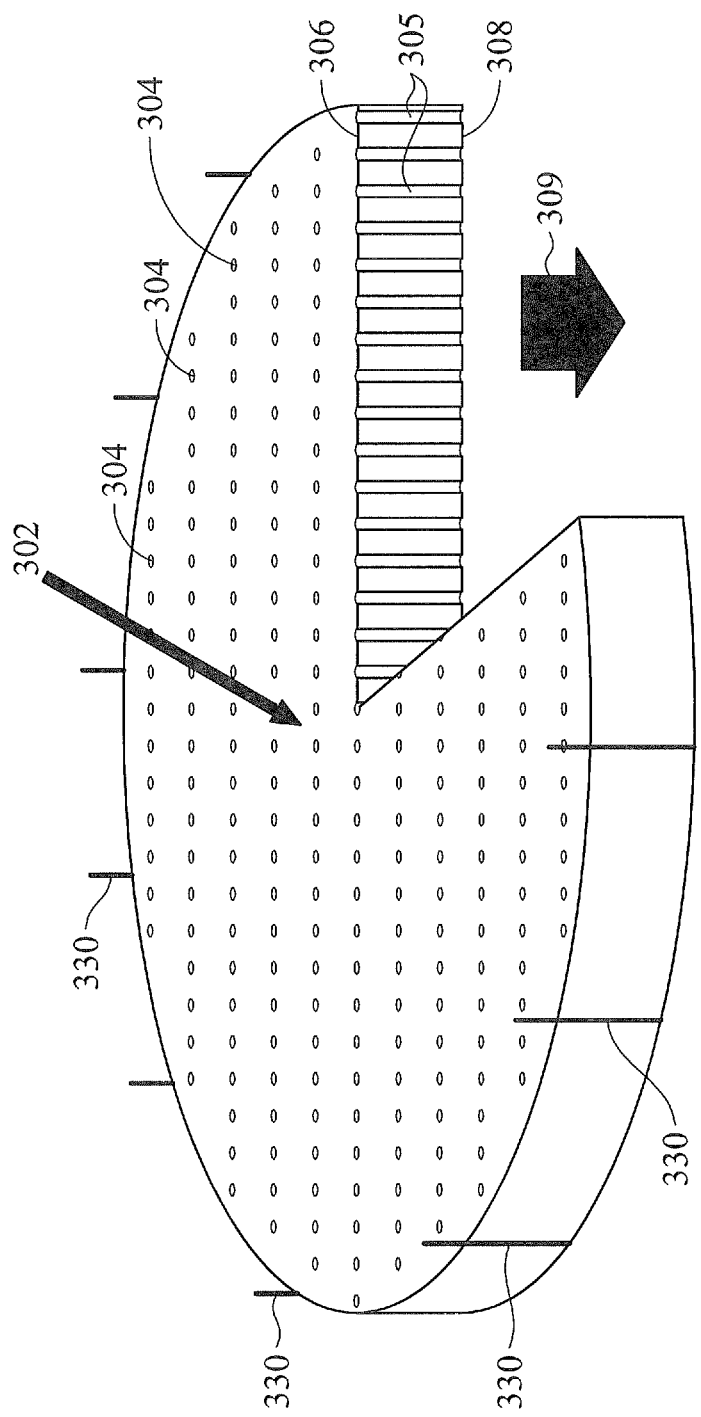
FIG. 3B is a perspective illustration of a suction platen with intermittent lateral guards, in accordance with some embodiments.

FIG. 3B is a perspective illustration of the suction platen 302 with intermittent lateral guards 330, in accordance with some embodiments. The intermittent lateral guards 330 may contrast with a continuous lateral guard which is continuous around an extreme edge (e.g., a circumference) of the suction platen 302. The intermittent lateral guards 330 may extend from the upper surface 306 to secure a pad that rests on the upper surface 306 from undesirable lateral movement, especially when the suction force 309 is not applied to the suction openings 304.

In certain embodiments, the intermittent lateral guards 330 may be part of (e.g., adhered to or formed as one piece with) the suction platen 302 to move (e.g., spin) with the suction platen 302 during performance of CMP or may be separate from the suction platen 302 to not move with the suction platen 302 during performance of CMP. Also, the intermittent lateral guards 330 may not be continuous and may be intermittent around the extremities of the pad in a manner sufficient to orient the pad on the suction platen 302. Advantageously, when the lateral guards 330 are intermittent and not continuous around the extremities of the pad, the pad may be more easily removed from the suction platen 302 by directly manipulating the pad from a lateral direction, rather than needing to avoid the lateral guards 330 and manipulate the pad from atop the pad.

Figure 4A:
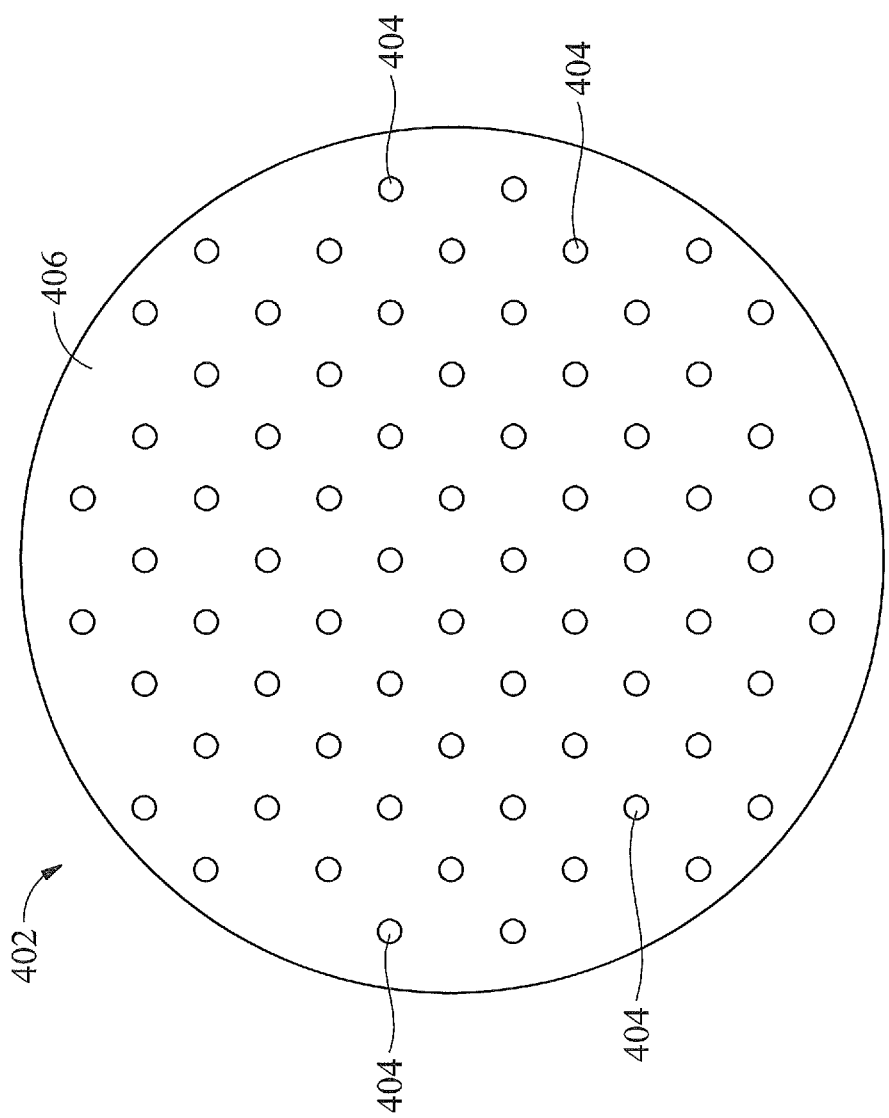
FIG. 4A is a plan view illustration of a suction platen with suction openings arranged in a grid, in accordance with some embodiments.

FIG. 4A is a plan view illustration of a suction platen 402 with suction openings 404 arranged in a grid, in accordance with some embodiments. The suction openings 404 may be arranged in a grid for even distribution of the suction force along the upper surface 406 of the platen. By being patterned in a grid, the relative position of respective adjacent suction openings 404 may be consistent. For example, the shortest distance of adjacent suction openings from each other may be from about 1 millimeters (mm) to about 30 cm to produce a level of overall suction sufficient to adhere a pad to the suction platen (e.g., without slippage).

Figure 4B:
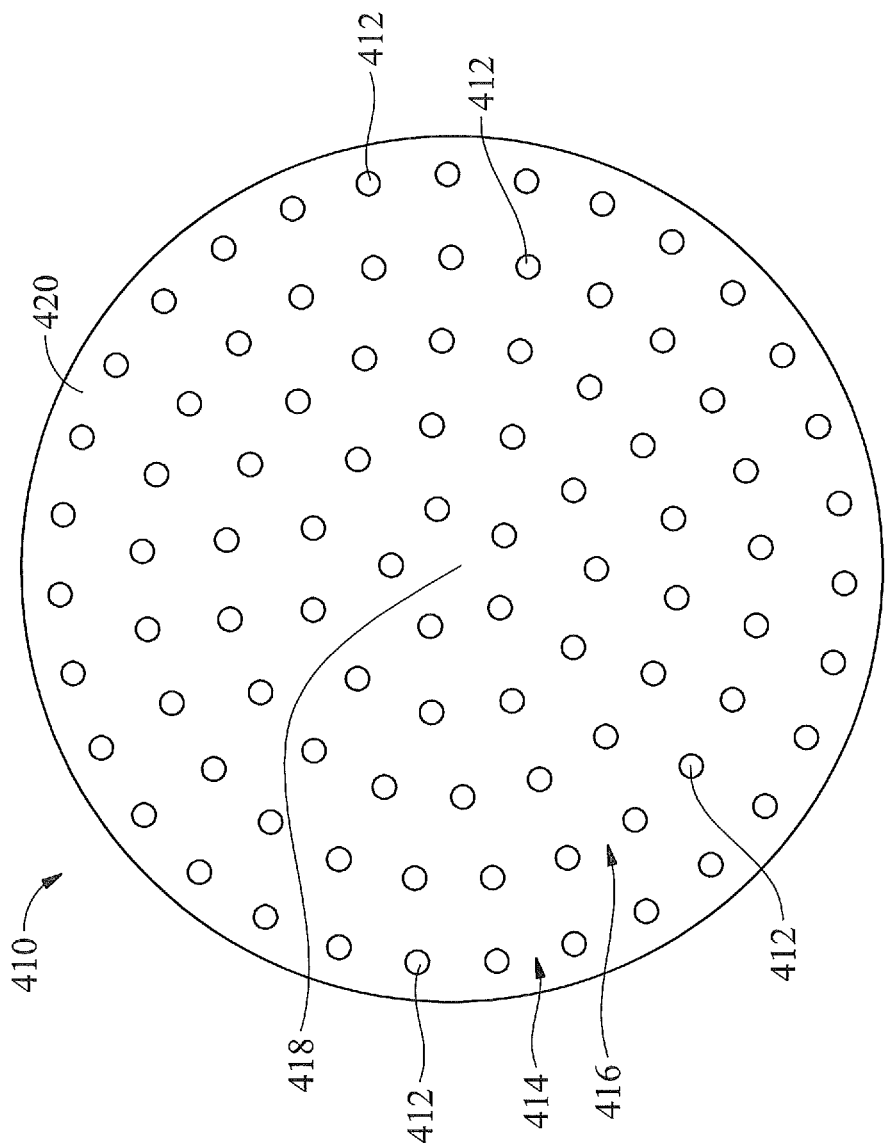
FIG. 4B is a plan view illustration of a suction platen with suction openings arranged concentrically, in accordance with some embodiments.

FIG. 4B is a plan view illustration of a suction platen 410 with suction openings 412 arranged concentrically, in accordance with some embodiments. By being arranged concentrically, the suction openings 412 may form the shape of several rings that are concentric with each other. For example, suction openings 412 may be part of a first ring 414 that is concentric with a second ring 416. In particular embodiments, there may not be a suction opening 404 at a center axis 418 of a suction platen 420 while in other embodiments there may be a suction opening 404 at the center axis 418 of the suction platen 410.

Figure 4C:
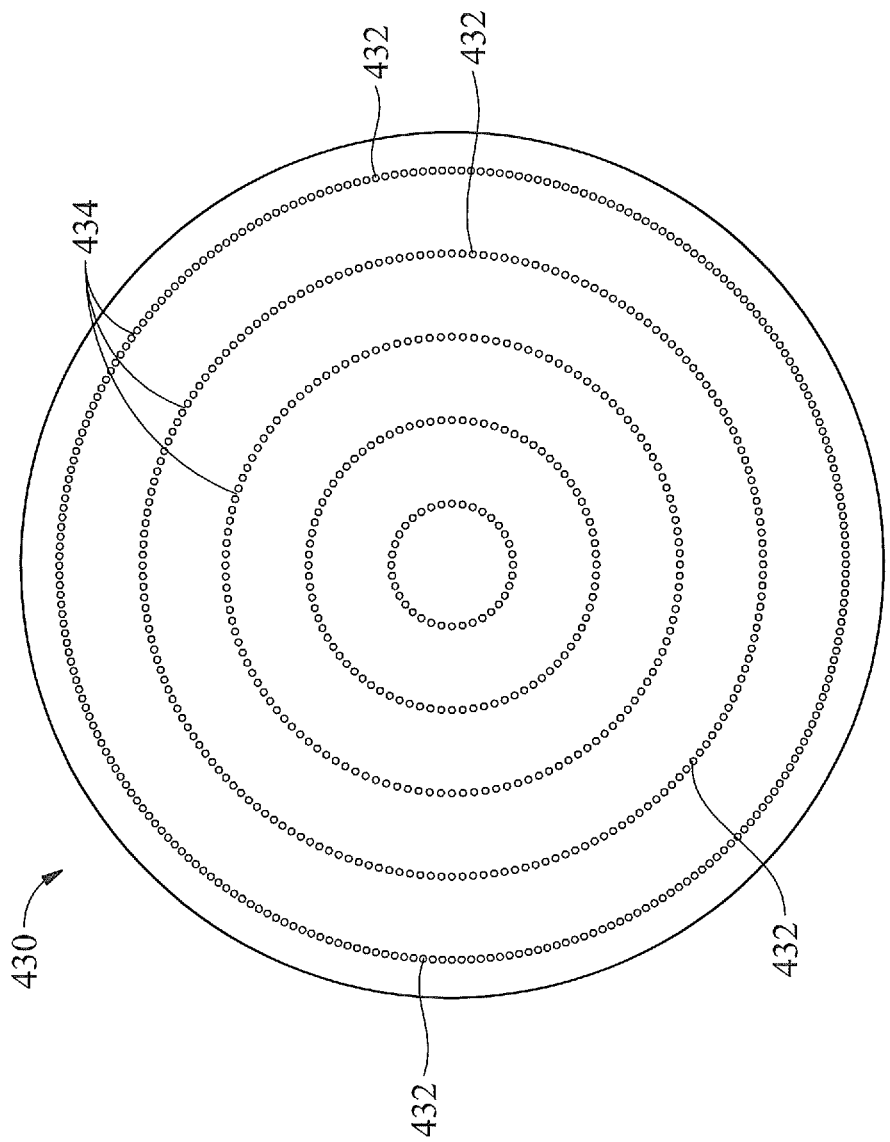
FIG. 4C is a plan view illustration of a suction platen with suction openings in each concentric ring closer than suction openings in different concentric rings, in accordance with some embodiments.

FIG. 4C is a plan view illustration of a suction platen 430 with suction openings 432 in each concentric ring 434 closer to each other than suction openings 432 in different concentric rings 434, in accordance with some embodiments. As illustrated, each concentric ring 434 may include multiple suction openings 432. Each suction opening 432 may also be relatively closer to other suction openings within its respective concentric ring 434 than suction openings 432 in other concentric rings.

Figure 4D:
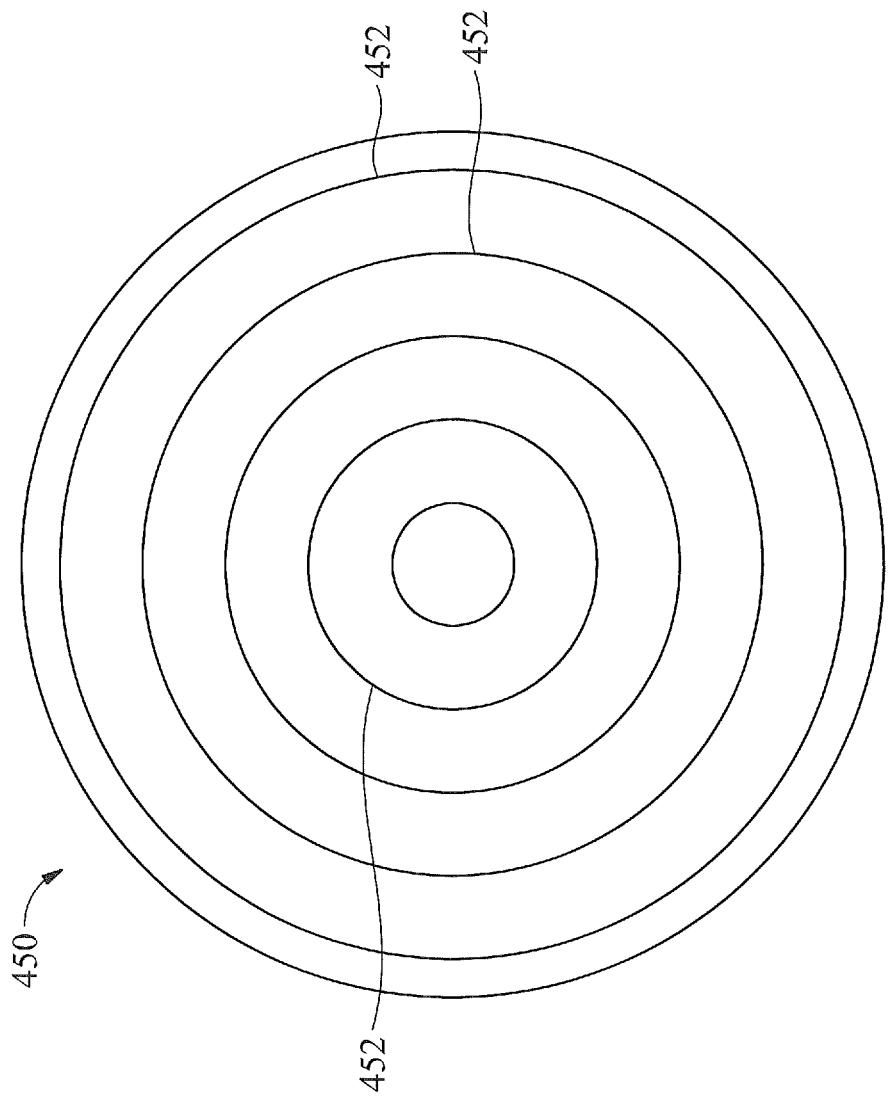
FIG. 4D is a plan view illustration of a suction platen with suction openings as concentric rings, in accordance with some embodiments.

FIG. 4D is a plan view illustration of a suction platen 450 with suction openings 452 as concentric rings, in accordance with some embodiments. As illustrated, each concentric ring may include a single suction opening 452. Stated another way, each suction opening 452 may be shaped as a concentric ring. Each suction opening 452 in the shape of a concentric ring may be associated with a pump that produces a lower atmospheric pressure at a respective suction opening 452 in the shape of a concentric ring than at other parts of the suction platen 450. Also, the suction platen 450 may be supported by (e.g., rest on, or be coupled with) a pump support structure that also supports the respective pumps in fluid communication with a respective suction opening 452 in the shape of a concentric ring. Accordingly, the suction platen 450 may move with the pump support structure.

Figure 4E:
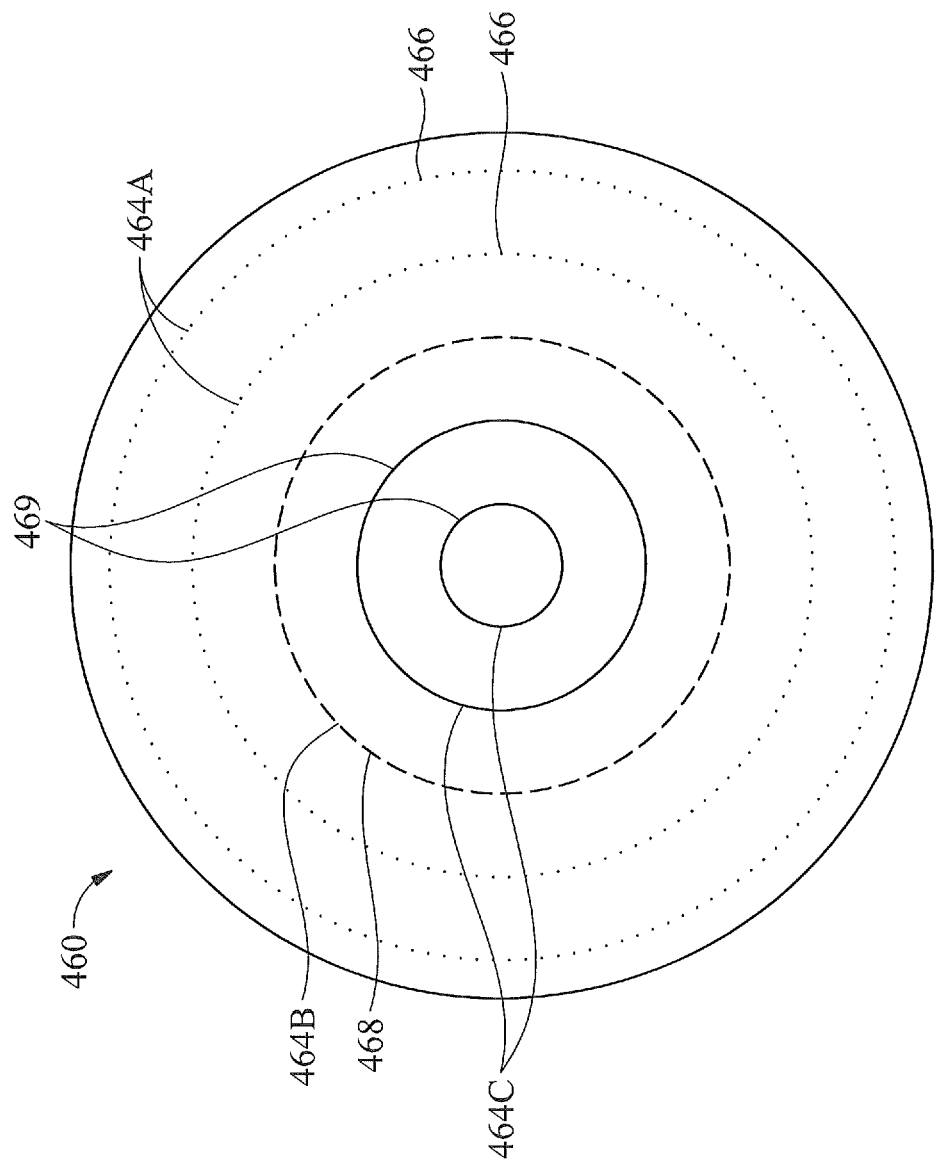
FIG. 4E is a plan view illustration of a suction platen with different suction openings in different concentric rings, in accordance with some embodiments.

FIG. 4E is a plan view illustration of a suction platen 460 with different suction openings in different concentric rings, in accordance with some embodiments. As illustrated, there may be three types of concentric rings, 464A, 464B, 464C. The first type of concentric ring 464A may include suction openings 466 with each suction opening shaped as a circle. The second type of concentric ring 464B may include suction openings 468 with each suction opening shaped as a rectangle. Also, each suction opening 468 of the second type of concentric ring 464B may have a larger cross sectional area than each suction opening 466 of the first type of concentric ring 464A. The third type of concentric ring 464C may include a single suction opening 469 such as ring. Stated another way, each suction opening 469 of the third type of concentric ring 464C may be shaped as a concentric ring. Advantageously, the differently sized suction openings may apply a different amount of suction force based on the cross sectional area of the suction opening to calibrate the amount of suction force per suction opening to scale with an amount of centrifugal force at a particular region of the pad 102. For example, greater suction force may be at the suction openings 466 that may experience greater centrifugal force than the other suction openings in virtue of the smaller cross section at the suction openings 466.

Figure 5A:
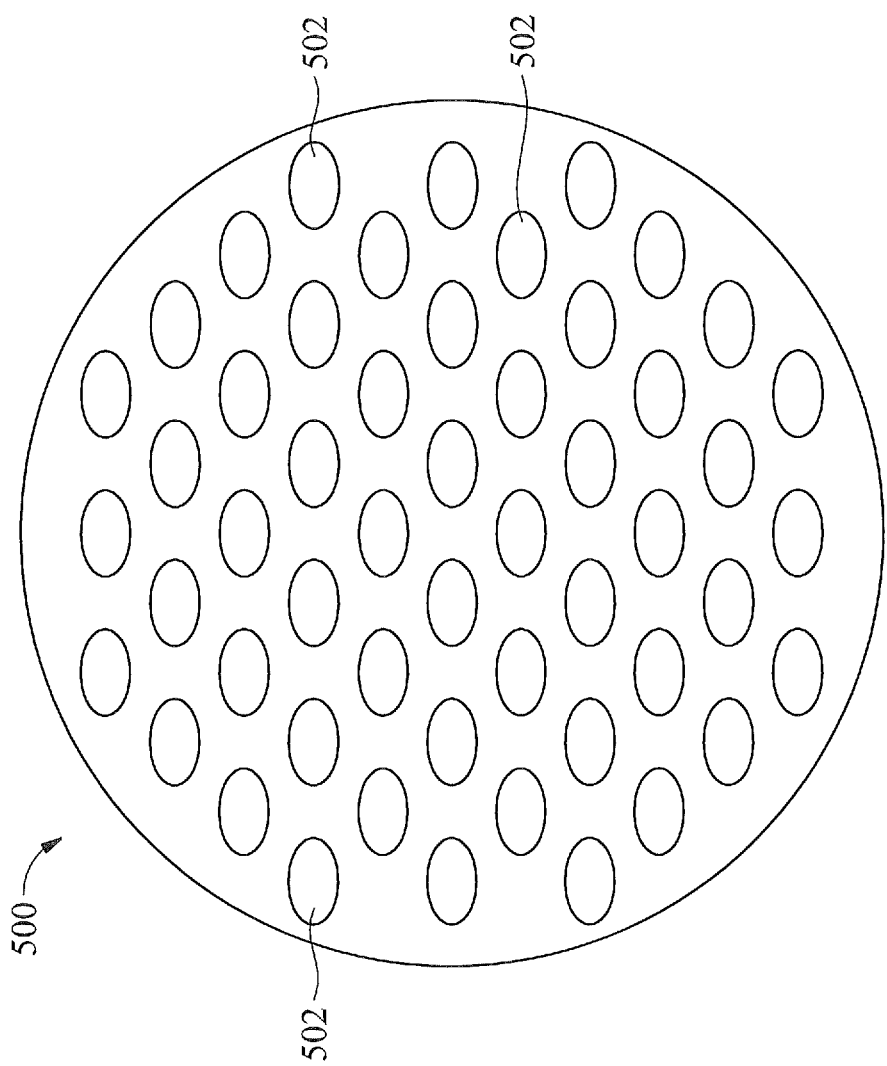
FIG. 5A is a plan view illustration of a suction platen with elliptical suction openings, in accordance with some embodiments.

FIG. 5A is a plan view illustration of a suction platen 500 with elliptical suction openings 502, in accordance with some embodiments. As illustrated, the elliptical suction openings 502 may be suction openings that are formed in the shape of an ellipse.

Figure 5B:
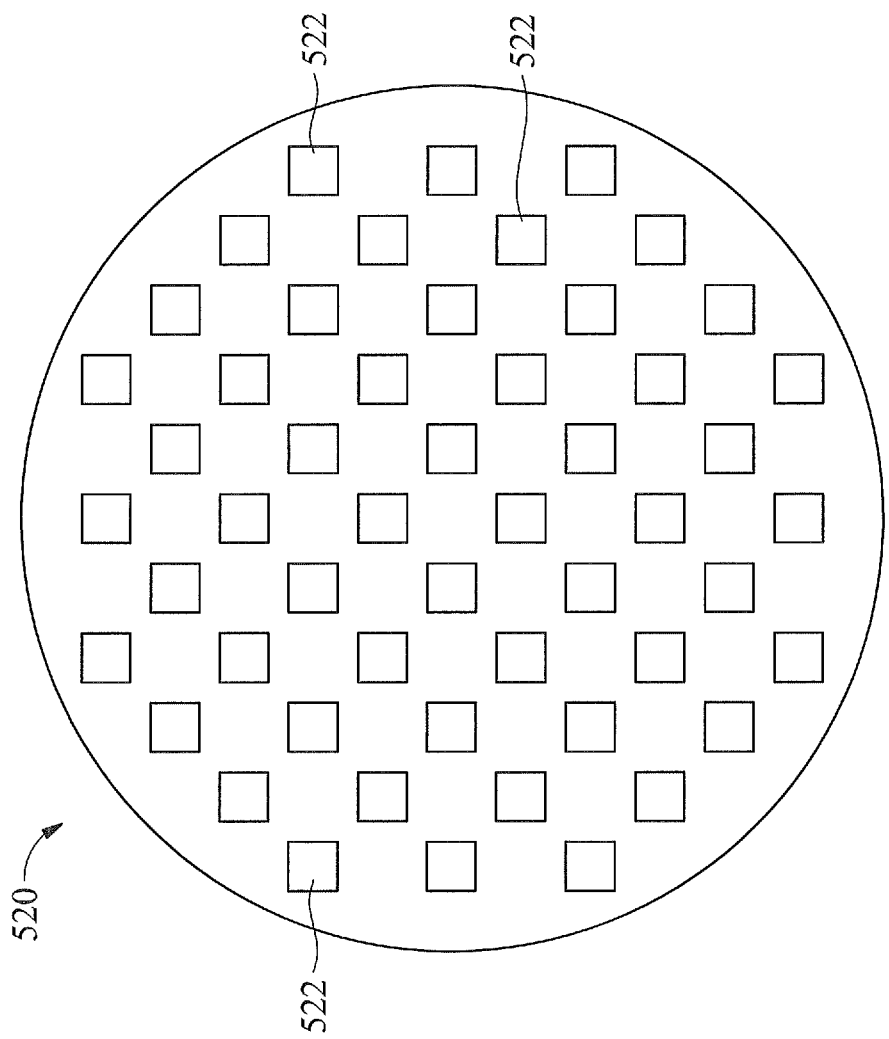
FIG. 5B is a plan view illustration of a suction platen with square suction openings, in accordance with some embodiments.

FIG. 5B is a plan view illustration of a suction platen 520 with square suction openings 522, in accordance with some embodiments. As illustrated, the square suction openings 522 may be suction openings that are formed in the shape of a square.

Figure 5C:
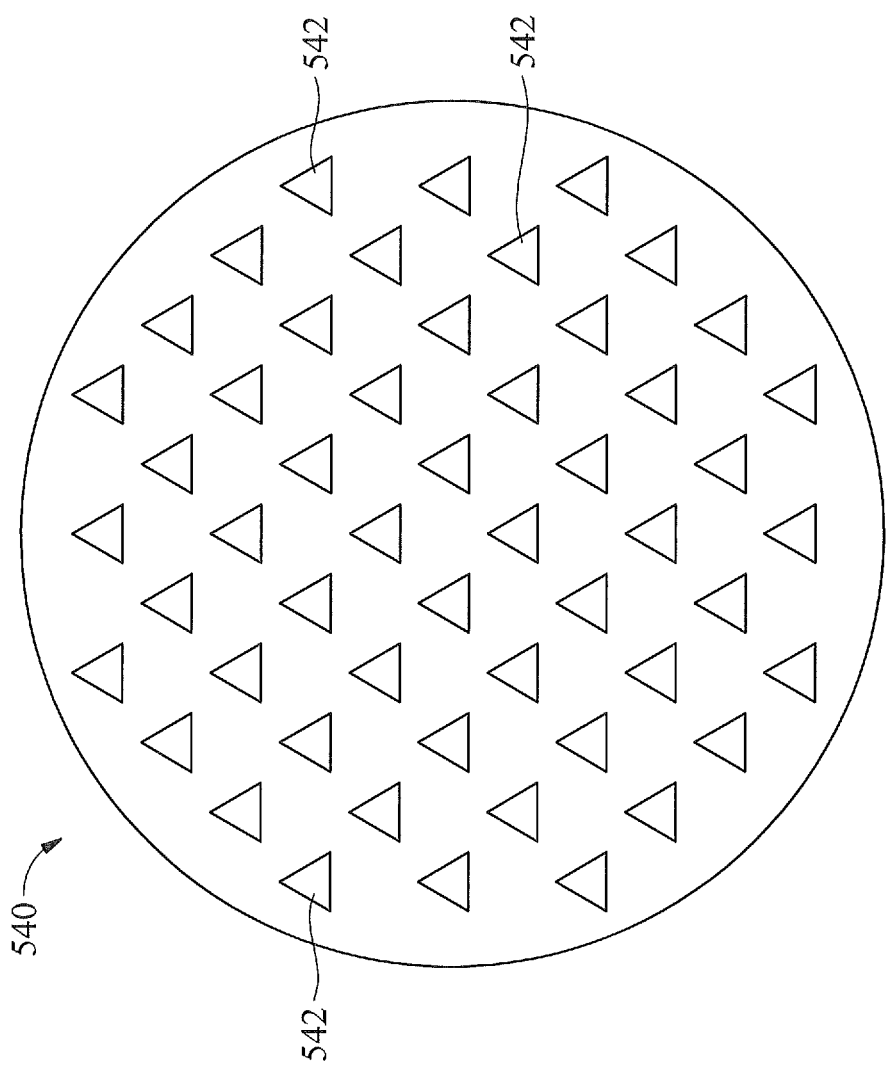
FIG. 5C is a plan view illustration of a suction platen with triangular suction openings, in accordance with some embodiments.

FIG. 5C is a plan view illustration of a suction platen 540 with triangular suction openings 542, in accordance with some embodiments. As illustrated, the triangular suction openings 542 may be suction openings that are formed in the shape of a triangle.

Figure 5D:
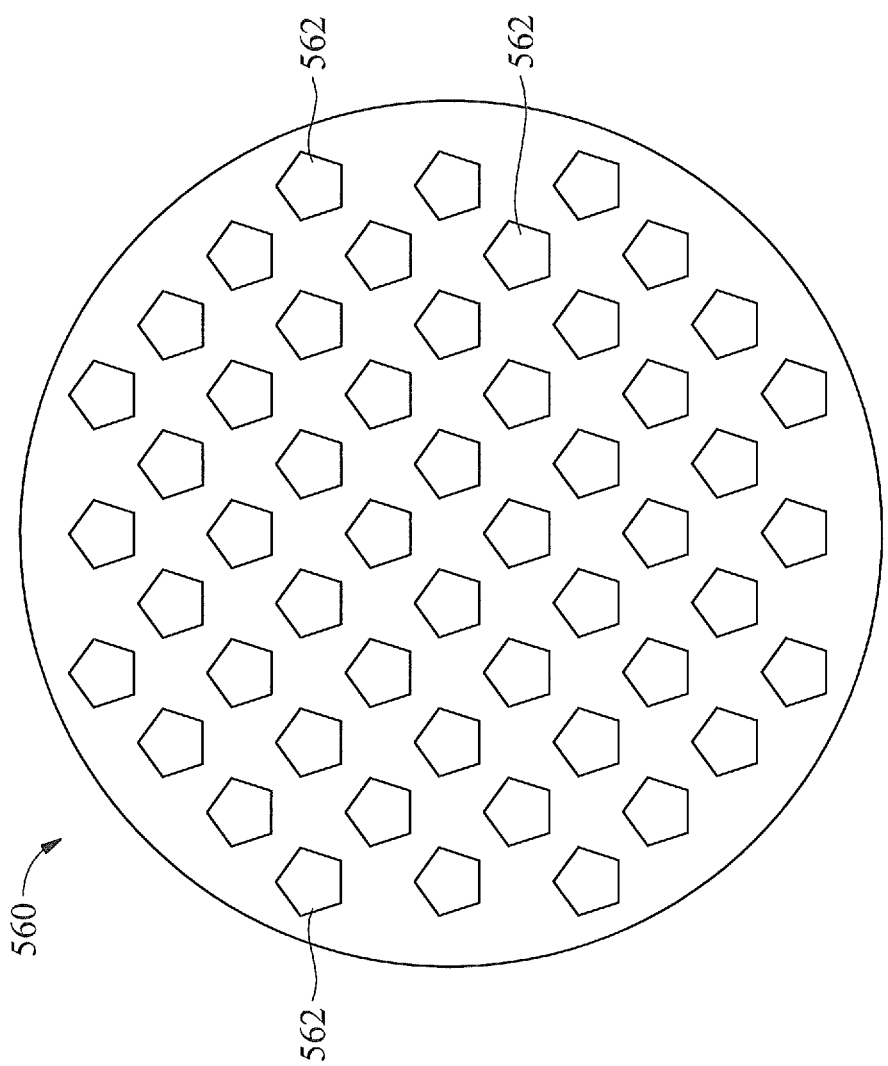
FIG. 5D is a plan view illustration of a suction platen with polygonal suction openings, in accordance with some embodiments.

FIG. 5D is a plan view illustration of a suction platen 560 with polygonal suction openings 562, in accordance with some embodiments. As illustrated, the polygonal suction openings 562 may be suction openings that are formed in the shape of a polygon (e.g., a pentagon).

Figure 6:
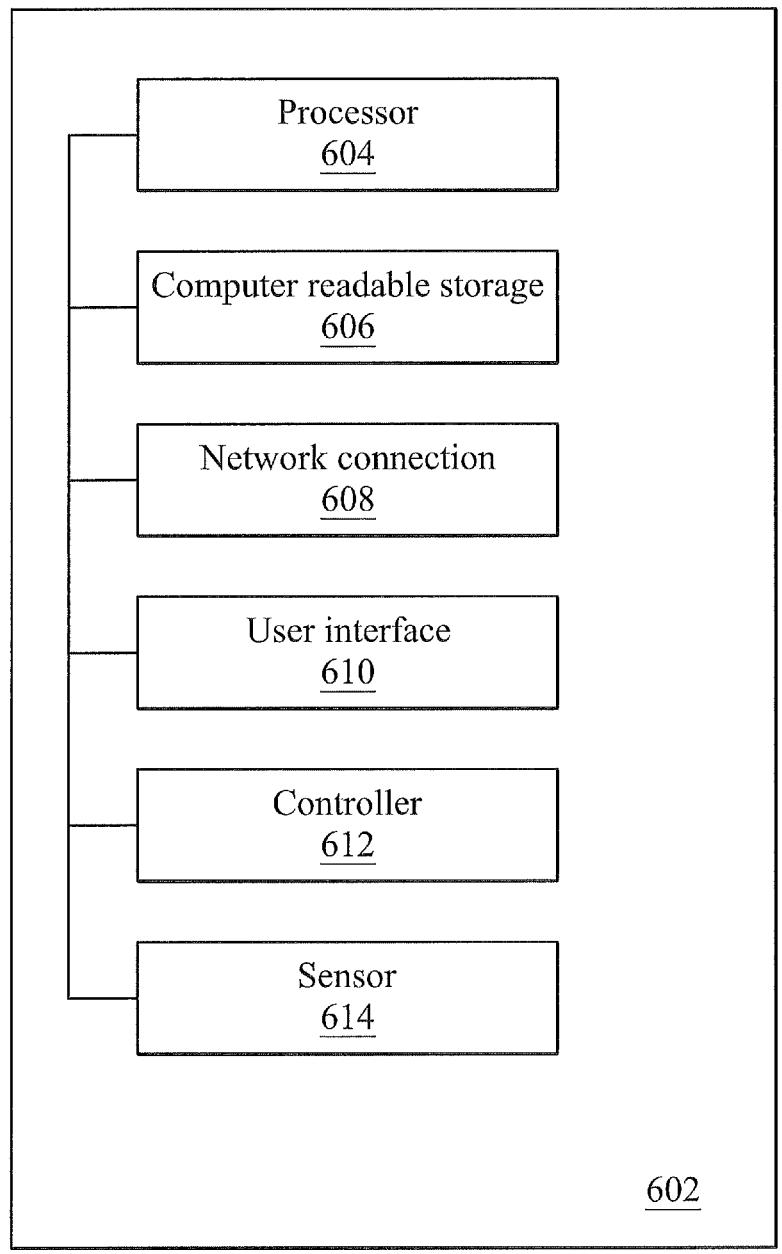
FIG. 6 is a block diagram of various functional modules of a suction pad assembly, in accordance with some embodiment.

FIG. 6 is a block diagram of various functional modules of a suction pad assembly 602, in accordance with some embodiment. The suction pad assembly 602 may include a processor 604. In further embodiments, the processor 604 may be implemented as one or more processors.

The processor 604 may be operatively connected to a computer readable storage module 606 (e.g., a memory and/or data store), a network connection module 608, a user interface module 610, a controller module 612, and a sensor module 614. In some embodiments, the computer readable storage module 606 may include suction pad assembly process logic that may configure the processor 604 to perform the various processes discussed herein. The computer readable storage 606 may also store data, such as sensor data characterizing suction pad assembly defects or abnormalities (e.g., lifting of a pad from a suction platen), control instructions for a suction pad assembly, identifiers for a pad, identifiers for a suction platen, identifiers for a suction pad assembly, identifiers for a particular pump, and any other parameter or information that may be utilized to perform the various processes discussed herein.

The network connection module 608 may facilitate a network connection of the suction pad assembly 602 with various devices and/or components of the suction pad assembly 602 that may communicate (e.g., send signals, messages, instructions, or data) within or external to the suction pad assembly 602. In certain embodiments, the network connection module 608 may facilitate a physical connection, such as a line or a bus. In other embodiments, the network connection module 608 may facilitate a wireless connection, such as over a wireless local area network (WLAN) by using a transmitter, receiver, and/or transceiver. For example, the network connection module 608 may facilitate a wireless or wired connection with the processor 604 and the computer readable storage 606.

The suction pad assembly 602 may also include the user interface module 610. The user interface module 610 may include any type of interface for input and/or output to an operator of the suction pad assembly 602, including, but not limited to, a monitor, a laptop computer, a tablet, or a mobile device, etc.

The suction pad assembly 602 may include a controller module 612. The controller module 612 may be configured to control various physical apparatuses that control movement or functionality for a robotic arm, suction pad assembly, sensor, or any other controllable aspect of a suction pad assembly. For example, the controller module 612 may be configured to control movement or functionality for at least one of a door of a tool (e.g., a chamber with the tool), a rotational motor that rotates a suction platen around an axis of rotation, a pump, and the like. For example, the controller module 612 may control a motor or actuator. The controller may be controlled by the processor and may carry out the various aspects of the various processes discussed herein.

The sensor module 614 may represent a sensor configured to collect sensor data. As discussed above, a suction pad assembly may include sensors. These sensors may be configured to collect sensor data (e.g., perform inspections) as the suction pad assembly is utilized to perform a process such as CMP and/or while a motor produces a suction force at the suction openings of a suction platen.

Various types of sensors may be utilized for such inspections, such as optical sensors, pressure sensors, and the like. Examples of optical sensors may include, for example, a charge coupled device (CCD). These optical sensors may detect radiation across the visible light and/or non-visible light spectrum (e.g., the infrared spectrum). Pressure sensors may measure an air pressure relative to a standard pressure, such as an atmospheric pressure. For example, the pressure sensor may measure pressure relative to atmospheric pressure or a vacuum. In certain embodiments, a single sensor may be utilized to inspect a suction pad assembly for abnormalities. However, in other embodiments, multiple defect sensors may be utilized either simultaneously or in series to inspect a suction pad assembly for abnormalities.

Figure 7:
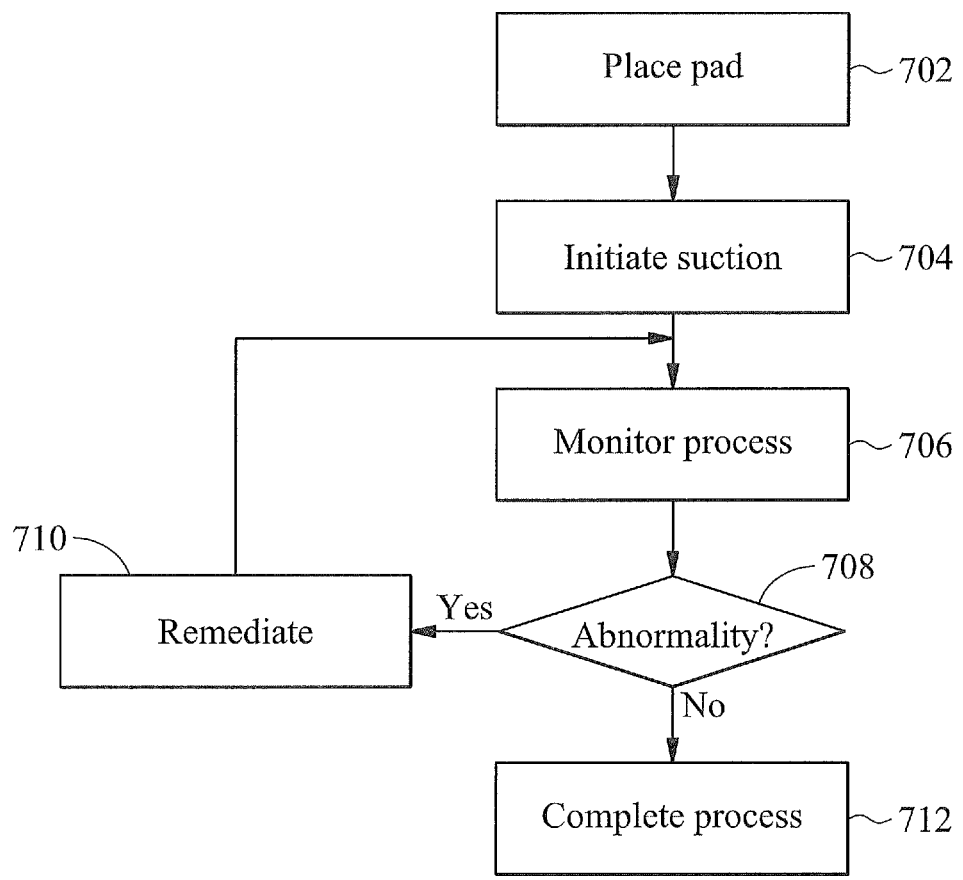
FIG. 7 is a flow chart of a suction pad assembly process, in accordance with some embodiments.

FIG. 7 is a flow chart of a suction pad assembly process 700, in accordance with some embodiments. The suction pad assembly process 700 may be performed by a suction pad assembly, as discussed above. It is noted that the process 700 is merely an example, and is not intended to limit the present disclosure. Accordingly, it is understood that additional operations may be provided before, during, and after the process 700 of FIG. 7, certain operations may be omitted, certain operations may be performed concurrently with other operations, and that some other operations may only be briefly described herein.

At operation 702, a pad may be placed on a suction platen. The pad may be placed on a suction platen by an operator of a suction platen assembly and/or may be placed on the suction platen in an automated manner, such as by using a robotic aim. The pad may be configured for CMP and thus have a working surface with a number of small asperities used to contact a wafer to be polished. Opposite the working surface, the pad may have an underlying surface configured to adhere to the suction platen via the suction force at the suction openings. In certain embodiments, the working surface and the underlying surface may have different textures. For example, the working surface may be rougher than the underlying surface.

At operation 704, a suction force may be initialized at the suction platen. The underlying surface of the pad may be configured to interface with suction openings from which a suction force may be applied to suck or adhere the pad to the suction platen. As noted above, a suction pad assembly may include a pump to produce a suction force at the suction openings of the suction platen. Accordingly, each suction opening may be associated with a pump to produce the suction force at each respective suction opening. In certain embodiments, all of the suction openings may be associated (e.g., in fluid communication with) a single pump. Accordingly, the single pump may drive the suction force at all of the suction openings. However, in other embodiments, not all of the suction openings are associated with a single pump. For example, each suction opening may be associated with its own pump and/or certain groups of suction openings may be associated with different suction pumps. In various embodiments, the suction openings may be structured such that the suction at the suction opening may be modulated by, for example, changing a cross sectional area of the suction opening to produce more or less suction at the suction opening.

At operation 706, the operation of the suction pad assembly may be monitored utilizing at least one sensor. Stated another way, sensors may be utilized to assess performance of the suction pad assembly during CMP in an automated manner. These sensors may be any type of sensor that may sense, for example, the amount or uniformity of suction at the suction openings and/or any surface non-uniformities that develop along the working surface of the pad during CMP.

As discussed above, CMP is a technique whereby the upper surface of a wafer is globally planarized by simultaneously abrasively polishing and etching the upper surface of the wafer. The wafer may be is positioned adjacent a pad that is moved with respect to the wafer. A force may push the wafer downward toward the pad. An abrasive encapsulated within a suspension fluid may be introduced. The pad is then applied to the wafer so that protrusions in the surface topography of the integrated circuits on the wafer can be removed by a combination of abrasive polishing and etching to thereby planarize and polish the upper surface of the wafer. Stated another way, as the platen is rotated, a slurry may flow on the pad to effectuate a pad cleaning process via CMP. This pad cleaning process, also referred to as a pad activation process, may be performed with water in certain embodiments.

At operation 708, a decision may be made as to whether an abnormality is detected from the sensor data characterizing the suction pad assembly. If yes, the process 700 may proceed to operation 710. If no, the process may proceed to operation 712.

An abnormality may represent a defect detectible by the sensor which may reduce wafer fabrication yield. For example, an abnormality such as a suction failure may be characterized by an insufficient or lack of suction force at particular suction openings. This may cause parts of the pad to lift from the suction platen. The lifting of the pad from the suction platen may be detrimental to CMP processing as it is a non-uniformity along the working surface of the pad utilized to polish a wafer. In contrast, it may be desirable to have the working surface be uniform and planar for effective polishing.

Abnormalities may be detected through the utilization of abnormality detection techniques, such as by the detection of non-uniformities, outliers, and/or variances as detected within collected sensor data. For example, abnormality detection techniques may assess sensor data (e.g., pressure sensor data over time or image data of multiple images) captured of a suction pad assembly over time as the suction platen spins or as suction force is applied to the suction platen by a pump. In an example of image sensor data, different frames or discrete parts (e.g., images or parts of images) of the image data may be compared to determine the presence of abnormalities or outliers in the image data. For example, edge detection, thresholding, color based segmentation, or other types of image segmentation techniques may be utilized to find various features in the image data. Then, based on comparing the detected features, outliers in the sensor data may be determined as possible abnormalities via supervised or unsupervised learning. The determination or definitions of outliers may be made in accordance with conventional statistical analysis for outliers. Accordingly, by analyzing aggregated data over time, an abnormality may be determined based on detection of an outlier from the aggregated data. In certain embodiments, these outliers may determine threshold values, which when passed, may define an abnormality. These outliers may be determined in accordance with conventional statistical analysis for outliers.

As noted above, various types of sensors may be utilized for inspections of a suction pad assembly, such as optical sensors, pressure sensors, and the like. Examples of optical sensors may include, for example, a charge coupled device (CCD). These optical sensors may detect radiation across the visible light and/or non-visible light spectrum (e.g., the infrared spectrum). Pressure sensors may measure an air pressure relative to a standard pressure, such as an atmospheric pressure. For example, the pressure sensor may measure pressure relative to atmospheric pressure or a vacuum. In certain embodiments, a single sensor may be utilized to inspect a suction pad assembly for abnormalities. However, in other embodiments, multiple defect sensors may be utilized either simultaneously or in series to inspect a suction pad assembly for abnormalities.

At operation 710, remediation may be performed based on the detected abnormality at operation 708. Stated another way, if an abnormality is detected, remediation of the suction pad assembly may be performed to remediate and correct for the abnormality. For example, the CMP process may be stopped and the pad replaced in remediation. Or, as another example, a particular pump associated with the abnormality may be inspected, repaired, and/or replaced in remediation. As yet another example, the pad may be adjusted in remediation based on the abnormality. As another example, remediation may include pulsing the suction force so that the suction force is not continuous over a period of time but has different levels of suction at regular intervals of time. As another example, remediation may include producing a different suction strength at a particular region of the suction platen, such as producing a greater or lesser suction strength at suction openings closer to a center of the suction platen (e.g., closer to a central axis) relative to suction openings not as close to the center of the suction platen. As another example, remediation may comprising producing a greater or lesser suction strength at suction openings closer to an extremity or a circumference of the suction platen relative to suction openings not as close to the extremity or the circumference of the suction platen.

In certain embodiments, different types of detected abnormalities, or the passage of different threshold values may warrant different types of remediation. For example, passage of a first threshold value for sensor data characterizing the uniformity of a pad may trigger remediation that includes stopping a CMP process and restarting the CMP process. However, passage of a second threshold value for sensor data characterizing the uniformity of a pad after remediation has already been previously performed for the pad may trigger an escalated act of remediation that includes replacement of the pad. In other embodiments, the first threshold value may be lower than that of the second threshold value to reflect a situation where the remediation performed based on the first threshold value was ineffective and thus a more extreme remediation is warranted.

In certain embodiments, a detected abnormality may be indicative of slippage or a mismatching degree of rotation between the suction platen and pad. Also, an associated remediation may be the production of a greater amount of suction strength at each of the suction openings or a greater amount of suction strength at suction openings (e.g., peripheral suction openings) closer to an extremity or a circumference of the suction platen relative to suction openings not as close to the extremity or the circumference of the suction platen (e.g., a center suction opening).

In particular embodiments, a detected abnormality may be indicative of a gas bubble over a certain size (e.g., volume or cross sectional area) between the suction platen and pad. Also, an associated remediation may be the replacement of the pad.

In further embodiments, a detected abnormality may be indicative of an undesirably high amount of energy use by the suction. Also, an associated remediation may be the production of a lower amount of suction strength at each of the suction openings or a lower amount of suction strength at suction openings (e.g., peripheral suction openings) closer to an extremity or a circumference of the suction platen relative to suction openings not as close to the extremity or the circumference of the suction platen (e.g., a center suction opening).

At operation 712, a process performed using the suction pad assembly may continue to completion. For example, the suction pad assembly may be utilized to completion of the CMP process if no abnormality is detected in operation 708.

In an embodiment, a system includes: a pad comprising a first side and a second side opposite the first side, wherein the first side is configured to receive a wafer during chemical mechanical planarization (CMP), and a platen adjacent the pad along the second side, wherein the platen comprises a suction opening that interfaces with the second side; a pump configured to produce suction at the suction opening to adhere the second side to the platen; and a sensor configured to collect sensor data characterizing a uniformity of adherence between the pad and the platen, wherein the pump is configured to produce the suction at the suction opening based on the sensor data.

In another embodiment, a system includes: a pad configured to receive a wafer during chemical mechanical planarization (CMP), and a platen adjacent the pad, wherein the platen comprises a suction opening that interfaces with the pad; a pump configured to produce suction at the suction opening to adhere the second side to the platen; and a sensor configured to collect sensor data characterizing a uniformity of adherence between the pad and the platen.

In another embodiment, a method includes: disposing a pad on a platen, wherein the platen comprises a suction opening that interfaces with the pad; producing suction at the suction opening; performing a chemical mechanical planarization process on the pad; detecting an abnormality at the pad or the platen during performance of the chemical mechanical planarization process; and adjusting the pad based on the abnormality.

The foregoing outlines features of several embodiment's so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
   a pad comprising a first side and a second side opposite the first side, wherein the first side is configured to receive a wafer during chemical mechanical planarization (CMP) process, and
   a platen adjacent the pad along the second side, wherein the platen comprises a plurality of suction openings that interface with the second side, wherein a first subset of the plurality of suction openings are formed in a first ring on the platen, and a second subset of the plurality of suction openings are formed in a second ring on the platen, the second ring being concentric with and internal to the first ring, and wherein each of the second subset of suction openings has a larger cross-sectional area than each of the first subset of suction openings;

a pump configured to produce suction at the suction opening to adhere the second side to the platen; and a first sensor configured to collect first sensor data characterizing a uniformity of adherence between the pad and the platen; and at least one processor configured to stop the CMP process when an abnormality in the adherence of the pad is detected, wherein the abnormality is detected based on a plurality of features of the first sensor data, wherein the plurality of features is obtained using a color-based segmentation method, wherein the plurality of features identify outliers in the first sensor data, and wherein the abnormality in the adherence of the pad is detected based on the outliers in the first sensor data.

2. The system of claim 1, wherein each of the plurality of suction openings is in fluid communication with the pump.

3. The system of claim 1, wherein the pad is configured to slide along the platen on the second side.

4. The system of claim 1, wherein the first side is textured differently than the second side.

5. The system of claim 4, wherein the second side is smoother than the first side.

6. The system of claim 1, wherein there is a greater number of suction openings in the first subset of suction openings than in the second subset of suction openings.

7. A system, comprising:
a pad configured to receive a wafer during chemical mechanical planarization (CMP), wherein the pad comprises a first side configured receive the wafer and a second side opposite the first side;

a platen adjacent the pad, wherein the platen comprises a plurality of suction openings that interface with the second side of the pad, wherein a first subset of the plurality of suction openings are formed in a first ring on the platen, and a second subset of the plurality of suction openings are formed in a second ring on the platen, the second ring being concentric with and internal to the first ring, and wherein each of the second subset of suction openings has a larger cross-sectional area than each of the first subset of suction openings;

a pump configured to produce suction at the suction opening to adhere the second side of the pad to the platen;

a first sensor configured to collect first sensor data characterizing a uniformity of adherence between the pad and the platen; and at least one processor configured to stop the CMP process when an abnormality in the adherence of the pad is detected based on the first sensor data, wherein the abnormality is detected based on a plurality of features of the first sensor data, wherein the plurality of features is obtained using a color-based segmentation method, wherein the plurality of features identify outliers in the first sensor data, and wherein the abnormality in the adherence of the pad is detected based on the outliers in the first sensor data.

8. The system of claim 7, wherein the suction at each of the plurality of suction openings is between 0.0001 atmospheres (ATM) and 0.8 ATM.

9. The system of claim 7, wherein a cross sectional area of each of the plurality of suction openings is between 0.001 millimeters squared (mm2) to 10 mm2.

10. The system of claim 7, wherein a cross sectional shape of each of the plurality of suction openings is at least one of: a circle, an ellipse, a square, a triangle, and a polygon.

11. The system of claim 7, wherein:
the first subset of suction openings is in fluid communication with a first pump and the second subset of suction openings is in fluid communication with a second pump different than the first pump.

12. The system of claim 7, wherein the pump is configured to produce the suction at each of the plurality of suction openings based on the first sensor data.

13. The system of claim 7, wherein the pad is bound on the platen within a lateral guard.

14. A system, comprising:
a pad configured to receive a wafer during wafer manufacturing process, wherein the pad comprises a first side configured receive the wafer and a second side opposite the first side;

a platen adjacent the pad, wherein the platen comprises a plurality of suction openings that interface with the second side of the pad, wherein a first subset of the plurality of suction openings are formed in a first ring on the platen, and a second subset of the plurality of suction openings are formed in a second ring on the platen, the second ring being concentric with and internal to the first ring, and wherein each of the second subset of suction openings has a larger cross-sectional area than each of the first subset of suction openings;

a pump configured to produce suction at the suction opening to adhere the second side of the pad to the platen;

a first sensor configured to collect sensor data characterizing a uniformity of adherence between the pad and the platen, wherein the pump is configured to produce the suction at the suction opening based on the sensor data; and at least one processor configured to stop the wafer manufacturing process when an abnormality in the adherence of the pad is detected based on the sensor data, wherein the abnormality is detected based on a plurality of features of the sensor data, wherein the plurality of features is obtained using a color-based segmentation method, wherein the plurality of features identify outliers in the first sensor data, and wherein the abnormality in the adherence of the pad is detected based on the outliers in the first sensor data.

15. The system of claim 14, wherein the first sensor comprises an optical sensor configured to generate image data indicative of whether one or more folds are present on a surface of the pad.

16. The system of claim 14, wherein the wafer manufacturing process comprises a chemical mechanical planarization (CMP) process.

17. The system of claim 16, wherein the at least one processor is configured to stop the CMP process when the abnormality of the pad is detected based on the sensor data.

18. The system of claim 14, wherein the first side is textured differently than the second side.

19. The system of claim 18, wherein the second side is smoother than the first side.

20. The system of claim 14, wherein there is a greater number of suction openings in the first subset of suction openings than in the second subset of suction openings.

* * * * *